(12) United States Patent
Li et al.

(10) Patent No.: US 7,492,634 B2
(45) Date of Patent: *Feb. 17, 2009

(54) METHOD FOR PROGRAMMING OF MULTI-STATE NON-VOLATILE MEMORY USING SMART VERIFY

(75) Inventors: Yan Li, Milpitas, CA (US); Long Pham, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/862,157

(22) Filed: Sep. 26, 2007

(65) Prior Publication Data
US 2008/0013374 A1    Jan. 17, 2008

Related U.S. Application Data

(62) Division of application No. 11/260,658, filed on Oct. 27, 2005, now Pat. No. 7,301,817.

(51) Int. Cl.
*G11C 16/04* (2006.01)

(52) U.S. Cl. .............. 365/185.03; 365/185.07; 365/185.19; 365/185.21; 365/185.28

(58) Field of Classification Search ............ 365/185.03, 365/185.17, 185.19, 185.21, 185.28
See application file for complete search history.

(56) References Cited

U.S. PATENT DOCUMENTS

| | | | |
|---|---|---|---|
| 4,627,027 A | 12/1986 | Rai et al. | |
| 4,888,735 A | 12/1989 | Lee et al. | |
| 5,386,422 A | 1/1995 | Endoh | |
| 5,440,505 A | 8/1995 | Fazio et al. | |
| 5,570,315 A | 10/1996 | Tanaka | |

(Continued)

FOREIGN PATENT DOCUMENTS

WO     WO9828745     7/1998

OTHER PUBLICATIONS

Choi, et al., A Novel Booster Plate Technology in High Density NAND Flash Memories for Voltage Scaling-down and Zero Program Disturbance, Samsung Electronics Co., LTD., pp. 238-239, 1996 Symp. on VLSI Technology Digest of Technical Papers.

(Continued)

*Primary Examiner*—Hoai V Ho
(74) *Attorney, Agent, or Firm*—Vierra Magen Marcus & DeNiro LLP

(57) ABSTRACT

In a non-volatile memory, the initiation of program verification is adaptively set so that programming time is decreased. In one approach, non-volatile storage elements are programmed based on a lower page of data to have a voltage threshold ($V_{TH}$) that falls within a first $V_{TH}$ distribution or a higher, intermediate $V_{TH}$ distribution. Subsequently, the non-volatile storage elements with the first $V_{TH}$ distribution either remain there, or are programmed to a second $V_{TH}$ distribution, based on an upper page of data. The non-volatile storage elements with the intermediate $V_{TH}$ distribution are programmed to third and fourth $V_{TH}$ distributions. The non-volatile storage elements being programmed to the third $V_{TH}$ distribution are specially identified and tracked. Verification of the non-volatile storage elements being programmed to the fourth $V_{TH}$ distribution is initiated after one of the identified non-volatile storage elements transitions to the third $V_{TH}$ distribution from the intermediate $V_{TH}$ distribution.

20 Claims, 14 Drawing Sheets

U.S. PATENT DOCUMENTS

| | | | |
|---|---|---|---|
| 5,621,684 | A | 4/1997 | Jung et al. |
| 5,623,442 | A | 4/1997 | Gotou et al. |
| 5,729,494 | A | 3/1998 | Gotou et al. |
| 5,764,572 | A | 6/1998 | Hammick |
| 5,774,397 | A | 6/1998 | Endoh |
| 5,867,429 | A | 2/1999 | Chen et al. |
| 5,870,334 | A | 2/1999 | Hemink et al. |
| 5,920,507 | A | 7/1999 | Takeuchi et al. |
| 5,943,260 | A | 8/1999 | Hirakawa et al. |
| 5,949,714 | A | 9/1999 | Hemink et al. |
| 5,969,990 | A | 10/1999 | Arase |
| 6,011,287 | A | 1/2000 | Itoh et al. |
| 6,028,792 | A | 2/2000 | Tanaka et al. |
| 6,046,935 | A | 4/2000 | Takeuchi et al. |
| 6,049,494 | A | 4/2000 | Sakui et al. |
| 6,125,052 | A | 9/2000 | Tanaka |
| 6,222,762 | B1 | 4/2001 | Guterman et al. |
| 6,243,290 | B1 | 6/2001 | Kurata et al. |
| 6,301,151 | B1 | 10/2001 | Engh et al. |
| 6,324,121 | B2 | 11/2001 | Banks |
| 6,400,608 | B1 | 6/2002 | Fastow et al. |
| 6,404,675 | B2 | 6/2002 | Banks |
| 6,424,566 | B1 | 7/2002 | Parker |
| 6,456,528 | B1 | 9/2002 | Chen |
| 6,490,204 | B2 | 12/2002 | Bloom et al. |
| 6,522,580 | B2 | 2/2003 | Chen et al. |
| 6,525,964 | B2 | 2/2003 | Tanaka et al. |
| 6,529,412 | B1 | 3/2003 | Chen et al. |
| 6,535,423 | B2 | 3/2003 | Trivedi et al. |
| 6,538,922 | B1 | 3/2003 | Khalid et al. |
| 6,538,923 | B1 | 3/2003 | Parker |
| 6,542,407 | B1 | 4/2003 | Chen et al. |
| 6,643,188 | B2 | 11/2003 | Tanaka et al. |
| 6,657,891 | B1 | 12/2003 | Shibata et al. |
| 6,717,847 | B2 | 4/2004 | Chen |
| 6,745,286 | B2 | 6/2004 | Staub et al. |
| 6,771,536 | B2 | 8/2004 | Li et al. |
| 6,781,877 | B2 | 8/2004 | Cernea et al. |
| 6,807,095 | B2 | 10/2004 | Chen et al. |
| 6,859,397 | B2 | 2/2005 | Lutze |
| 7,046,568 | B2 | 5/2006 | Cernea |
| 7,068,542 | B2 | 6/2006 | Banks |
| 7,200,043 | B2 * | 4/2007 | Chen .................... 365/185.22 |
| 2001/0040824 | A1 | 11/2001 | Banks |
| 2002/0118574 | A1 | 8/2002 | Congwer et al. |
| 2002/0126532 | A1 | 9/2002 | Matsunaga et al. |
| 2003/0021155 | A1 | 1/2003 | Yachareni et al. |
| 2003/0147278 | A1 | 8/2003 | Tanaka et al. |
| 2003/0161182 | A1 | 8/2003 | Li et al. |
| 2004/0047182 | A1 | 3/2004 | Cernea et al. |
| 2004/0057283 | A1 | 3/2004 | Cernea |
| 2004/0057285 | A1 | 3/2004 | Cernea et al. |
| 2004/0057287 | A1 | 3/2004 | Cernea et al. |
| 2004/0057318 | A1 | 3/2004 | Cernea |
| 2004/0060031 | A1 | 3/2004 | Cernea |
| 2004/0095807 | A1 | 5/2004 | Suh et al. |
| 2004/0109357 | A1 | 6/2004 | Cernea et al. |
| 2004/0109362 | A1 | 6/2004 | Gongwer et al. |
| 2004/0255090 | A1 | 12/2004 | Guterman et al. |
| 2005/0024939 | A1 | 2/2005 | Chen |
| 2005/0083735 | A1 | 4/2005 | Chen et al. |
| 2005/0162924 | A1 | 7/2005 | Guterman |
| 2006/0126390 | A1 | 6/2006 | Gorobets |
| 2006/0140007 | A1 | 6/2006 | Cernea |
| 2006/0158947 | A1 | 7/2006 | Chan |
| 2006/0211692 | A1 | 9/2006 | Mederski et al. |
| 2006/0221692 | A1 | 10/2006 | Chen et al. |
| 2007/0097747 | A1 | 5/2007 | Li |

OTHER PUBLICATIONS

Amendment dated Jul. 2, 2007 in U.S. Appl. No. 11/260,658.

European Office Action dated Sep. 4, 2008, European Patent Appl. No. 06826985.1, filed Oct. 26, 2006, Atty Docket No. SAND-01051EP0.

Taiwan Office Action dated Oct. 16, 2008, Taiwan Patent Appl. No. 095139561, filed Oct. 26, 2006, Atty Docket No. SAND-01051TW0.

* cited by examiner

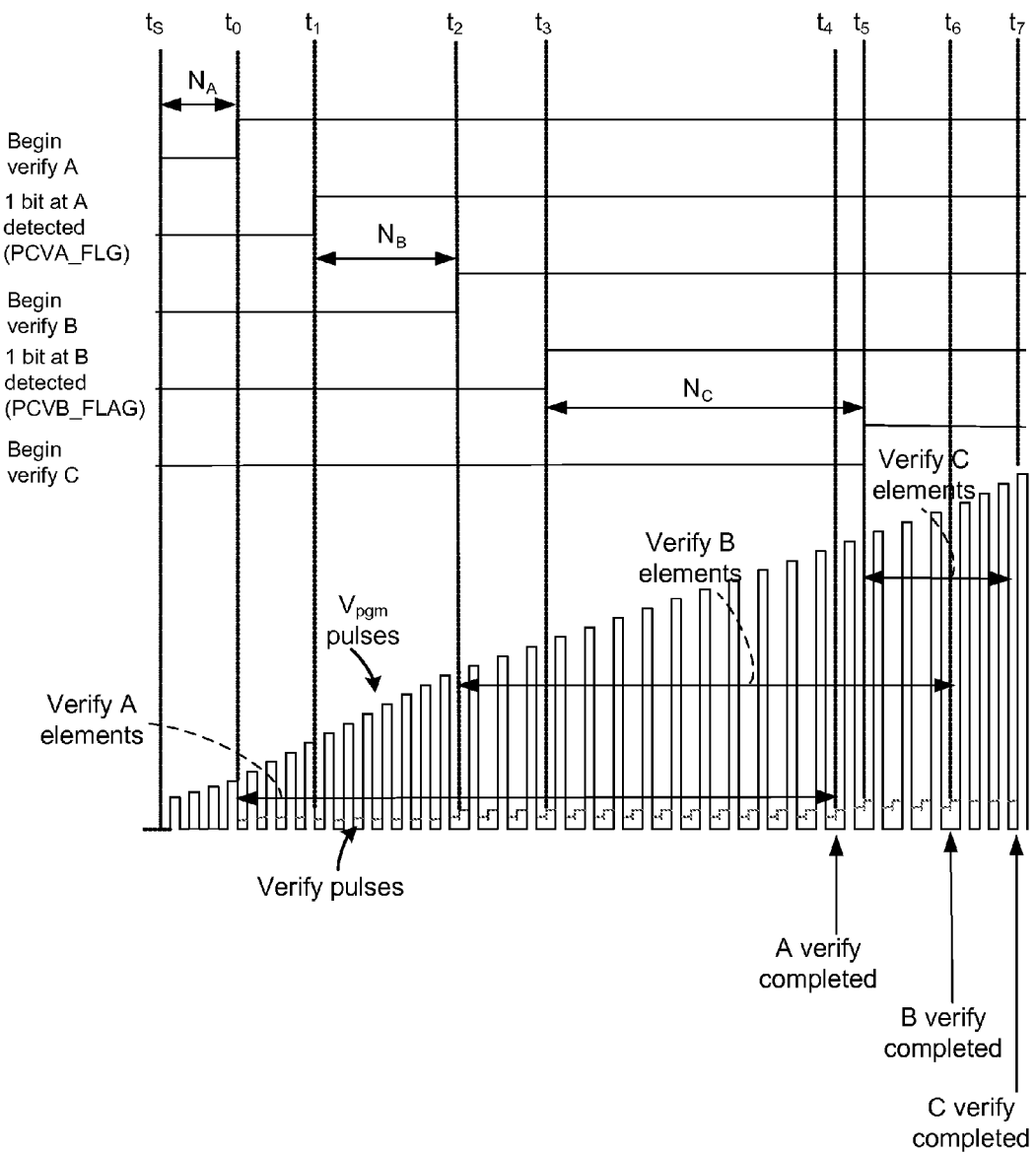

Lower Page Programming

Upper Page Programming

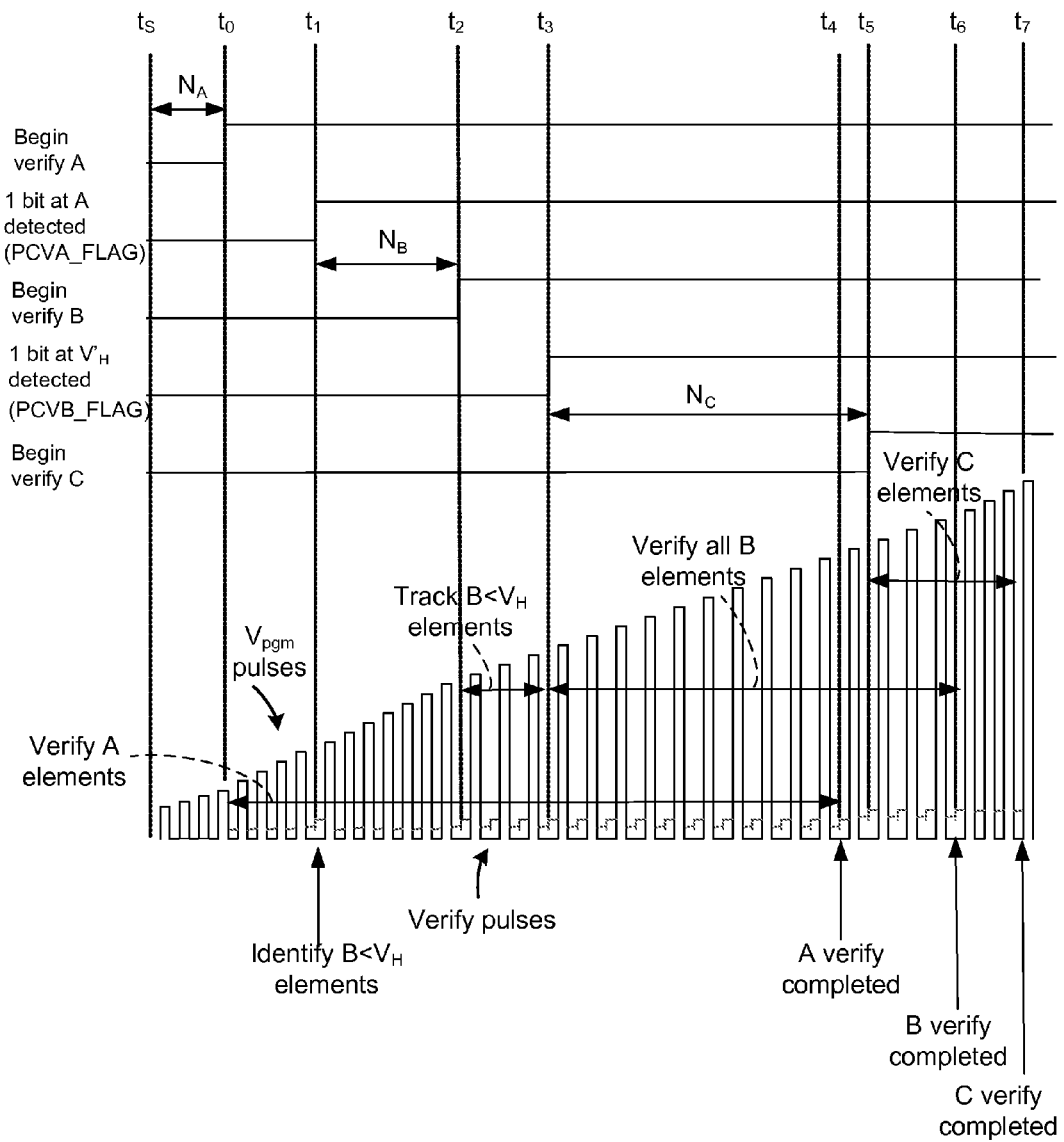

METHOD FOR PROGRAMMING OF MULTI-STATE NON-VOLATILE MEMORY USING SMART VERIFY

CROSS REFERENCE TO RELATED APPLICATIONS

This application is a divisional of U.S. patent application Ser. No. 11/260,658, filed Oct. 27, 2005, published as U.S. 2007/0097749 on May 3, 2007, issued as U.S. Pat. No. 7,301,817 and incorporated herein by reference.

BACKGROUND OF THE INVENTION

1. Field of the Invention

The present invention relates to programming non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage $V_{pgm}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{pgm}$ can be applied to the control gates (or, in some cases, steering gates) of flash memory elements. In the periods between the program pulses, verify operations are carried out. That is, the programming level of each element of a group of elements being programmed in parallel is tested between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

U.S. 2004/0109362, issued as U.S. Pat. No. 7,073,103 on Jul. 4, 2006, entitled 'Smart Verify For Multi-State Memories", incorporated herein by reference in its entirety, describes a process for minimizing the number of sequential verify operations for each program/verify/lockout step of a write sequence. Initially, only the lowest state of the multi-state range to which selected storage elements are programmed is checked during the verify phase. Once the first storage state is reached by one or more of the selected elements, the next state in a sequence of multi-states is added to the verify process. This next state can either be added immediately upon the fastest elements reaching the preceding state in the sequence, or after a delay of several program pulses. The adding of states to the set being checked in the verify phase continues through the rest of the set of multi-states in sequence, until the highest state has been added. Additionally, lower states can be removed from the verify set as all of the selected storage elements bound for these levels verify successfully to those target values and are locked out from further programming.

There is a need for additional "smart verify" techniques which are applicable to different programming schemes.

SUMMARY OF THE INVENTION

A method is provided for programming non-volatile storage elements by adaptively determining when programming verification should begin for at least some of the non-volatile storage elements. By avoiding unnecessary program verification steps, programming time and power consumption are reduced.

The technique described overcomes a problem that occurs when programming a lower page of data to an intermediate state before programming an upper page of data to a final state that overlaps with the intermediate state, e.g., in a "lower-middle" (LM) programming mode. In such a scenario, some of the non-volatile storage elements may have reached the final state when the lower page was programmed. Bit-pass detection, in which the first bit to reach the final state is detected, therefore cannot be performed when programming the upper page. Instead, it is desirable to detect the first bit to reach the final state from a starting point outside the final state, and to use this detection to determine when to start a subsequent "smart" verification.

In one embodiment, non-volatile storage elements in a set of non-volatile storage elements initially have respective voltage thresholds that fall within a common first voltage threshold distribution.

The non-volatile storage elements may be programmed to reach the common first voltage threshold distribution from a previous voltage threshold distribution, such as an erased state distribution. At least some of the non-volatile storage elements within the first voltage threshold distribution are programmed using successive voltage pulses so that their voltage thresholds reach a second voltage threshold distribution which overlaps with the first voltage threshold distribution, or reach a third voltage threshold distribution which is outside of the first and second voltage distributions. When the voltage threshold of one of the non-volatile storage elements transitions from a portion of the first voltage threshold distribution which is outside of the second voltage threshold distribution, to the second voltage threshold distribution, a determination is made as to when to initiate a verification process for verifying when the voltage threshold of other ones of the non-volatile storage elements have completed their transition from the first to the third voltage threshold distribution.

For example, the verification process can be initiated after a predetermined number of voltage pulses have been applied to the non-volatile storage elements that are transitioning to the third voltage threshold distribution, after it is determined that the voltage threshold of one of the non-volatile storage elements has completed the transition to the second voltage threshold distribution.

The transition of the non-volatile storage element from the first to the second voltage threshold distribution can be tracked by determining when the associated voltage threshold transitions past a lower voltage threshold, $V_L$, which is below the second voltage threshold distribution, and then past a higher voltage threshold, $V'_H$, which is in the second voltage threshold distribution. $V'_H$ may exceed a lower boundary $V_H$ of the second voltage threshold distribution by a margin which accounts for a sensing margin and/or a noise margin.

The different threshold voltage distributions may represent different binary data states in a multi-level non-volatile storage element.

BRIEF DESCRIPTION OF THE DRAWINGS

FIG. 11 depicts a time sequence of events in programming non-volatile storage elements using sequential programming while adaptively determining when program verification should begin.

FIG. 15 depicts a time sequence of events in programming non-volatile storage elements using an upper page of data, following the time sequence of FIG. 14.

DETAILED DESCRIPTION

Figure 1:
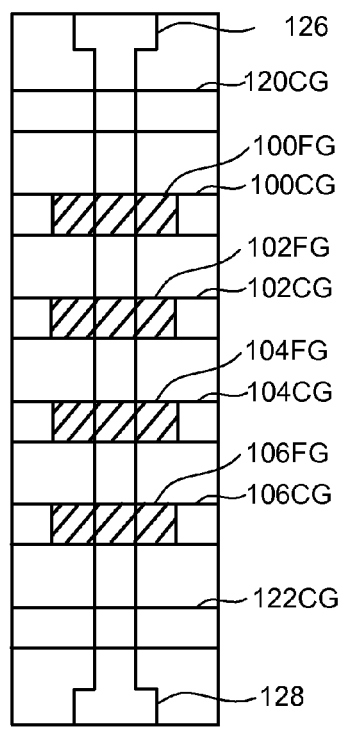
FIG. 1 is a top view of a NAND string.
Figure 2:
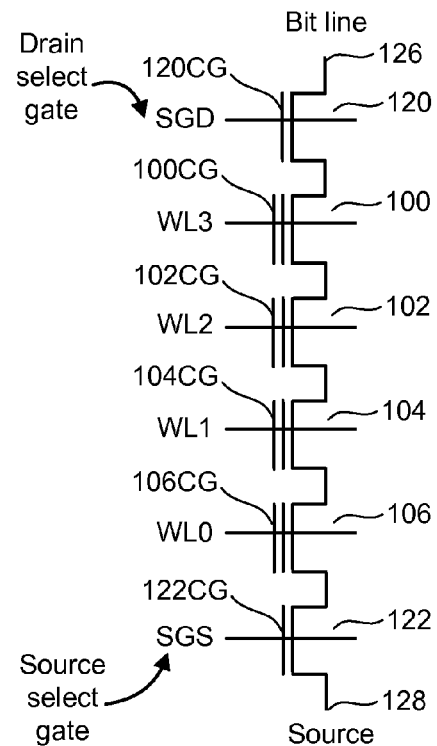
FIG. 2 is an equivalent circuit diagram of the NAND string of FIG. 1.

One example of a non-volatile memory system suitable for implementing the present invention uses the NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or elements. In other designs, the storage elements may include multiple transistors or may be different than those depicted in FIGS. 1 and 2. Select gate 120 is connected to drain select line SGD, while select gate 122 is connected to source select line SGS.

Figure 3:
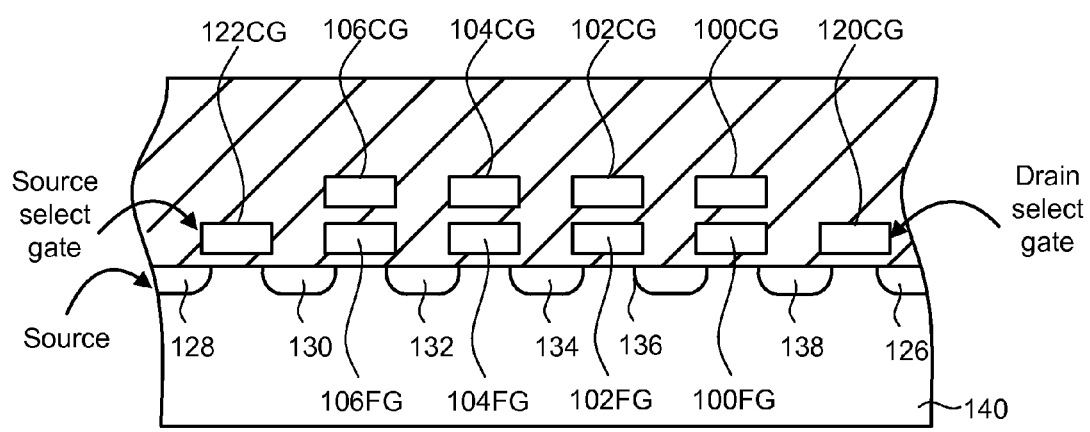
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the storage elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four storage elements in the NAND string, the use of four transistors is provided only as an example. A NAND string used with the technology described herein can have less than four storage elements or more than four storage elements. For example, some NAND strings will include eight, sixteen, thirty-two, sixty-four or more storage elements. The discussion herein is not limited to any particular number of storage elements in a NAND string.

Each storage element can store data represented in analog or digital form. When storing one bit of digital data, the range of possible threshold voltages of the storage element is divided into two ranges, which are assigned logical data "1" and "0." In one example of a NAND-type flash memory, the voltage threshold is negative after the storage element is erased, in what may be defined as the logic "1" state. The threshold voltage is positive after a program operation, in what may be defined as the logic "0" state. When the threshold voltage is negative and a read is attempted by applying 0 V to the control gate, the storage element will turn on to indicate logic one is being stored. When the threshold voltage is positive and a read operation is attempted by applying 0 V to the control gate, the storage element will not turn on, which indicates that logic zero is stored.

A storage element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the storage element and the threshold voltage ranges of the element depends upon the data encoding scheme adopted for the storage elements. For example, U.S. Pat. No. 6,222,762 and U.S. patent application Ser. No. 10/461,244, "Tracking Cells For A Memory System," filed on Jun. 13, 2003, published as U.S. 2004/0255090 on Dec. 16, 2004, and issued as U.S. Pat. No. 7,237,074 on Jun. 26, 2007, both of which are incorporated herein by reference in their entirety, describe various data encoding schemes for multi-state flash storage elements.

Relevant examples of NAND-type flash memories and their operation are provided in U.S. Pat. Nos. 5,386,422, 5,570,315, 5,774,397, 6,046,935, 6,456,528 and 6,522,580, each of which is incorporated herein by reference in its entirety. Other types of non-volatile memory, in addition to NAND flash memory, can also be used with the present invention.

Another type of storage element useful in flash EEPROM systems is the charge trapping element, which utilizes a non-conductive dielectric material in place of a conductive floating gate to store charge in a non-volatile manner. Such an element is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the storage element channel. The element is programmed by injecting electrons from the element channel into the nitride, where they are trapped and stored in a limited region. This stored charge then changes the threshold voltage of a portion of the channel of the element in a manner that is detectable. The element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar element in a split-gate configuration where a doped polysilicon gate extends over a portion of the storage element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The storage elements described in this paragraph can also be used with the present invention. Thus, the technology described herein also applies to coupling between dielectric regions of different storage elements.

Another approach to storing two bits in each element has been described by Eitan et al., "NROM: A Novel Localized Trapping, 2-Bit Nonvolatile Memory Cell," IEEE Electron Device Letters, vol. 21, no. 11, November 2000, pp. 543-545, which describes an ONO dielectric layer that extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The storage elements described in this paragraph can also be used with the present invention.

Figure 4:
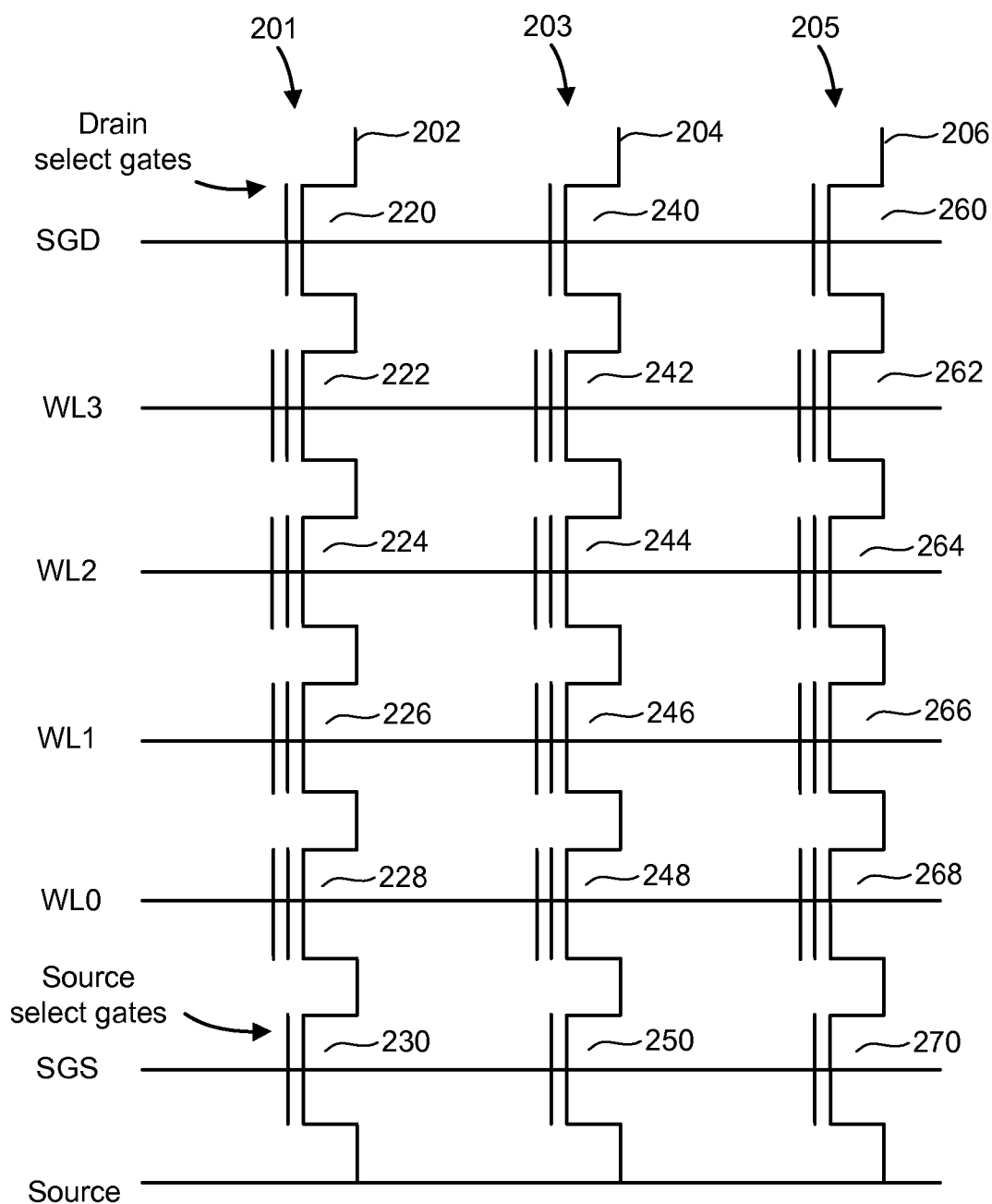
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 201, 203 and 205 are shown in a memory array having many more NAND strings. Each of the NAND strings includes two select transistors and four storage elements. For example, NAND string 201 includes select transistors 220 and 230, and storage elements 222, 224, 226 and 228. NAND string 203 includes select transistors 240 and 250, and storage elements 242, 244, 246 and 248. NAND string 205 includes select transistors 260 and 270, and storage elements 262, 264, 266 and 268. Each NAND string is connected to the source line by its select transistor (e.g., select transistor 230, 250 or 270). A selection line SGS is used to control the source side select gates. The various NAND strings 201, 203 and 205 are connected to respective bit lines 202, 204 and 206, by select transistors 220, 240, 260, etc., which are controlled by drain select line SGD. In other embodiments, the select lines do not necessarily need to be in common. Each word line connects the control gates of each storage element in the row. For example, word line WL3 is connected to the control gates for storage elements 222, 242 and 262. Word line WL2 is connected to the control gates for storage elements 224, 244 and 264. Word line WL1 is connected to the control gates for storage elements 226, 246 and 266. Word line WL0 is connected to the control gates for storage elements 228, 248 and 268. As can be seen, each bit line and the respective NAND string comprise the columns of the array or set of storage elements. The word lines (WL3, WL2, WL1 and WL0) comprise the rows of the array or set.

When programming a flash storage element, a program voltage is applied to the control gate of the element and the bit line associated with the element is grounded. Electrons from the p-well are injected into the floating gate. When electrons accumulate in the floating gate, the floating gate becomes negatively charged and the threshold voltage of the element is raised so that the storage element, e.g., storage element, is considered to be in a programmed state. More information about such programming can be found in U.S. Pat. No. 6,859,397, titled "Source Side Self Boosting Technique For Non- Volatile Memory," and in U.S. 2005/0024939, titled "Detecting Over Programmed Memory," filed on Jul. 29, 2003, issued as U.S. Pat. No. 6,917,542 on Jul. 12, 2005; both of which are incorporated herein by reference in their entirety.

To apply the program voltage to the control gate of the element being programmed, that program voltage is applied on the appropriate word line. That word line is also connected to one element in each of the other NAND strings that share the same word line. For example, when programming element 224 of FIG. 4, the program voltage will also be applied to the control gate of element 244. A problem arises when it is desired to program one element on a word line without programming other elements connected to the same word line, for example, when it is desired to program element 224 but not element 244. Because the program voltage is applied to all elements connected to a word line, an unselected element (an element that is not to be programmed) on the word line, especially an element adjacent to the element selected for programming, may become inadvertently programmed, in the process referred to as program disturb. For example, when programming element 224, there is a concern that the adjacent element 244 might unintentionally be programmed.

Several techniques can be employed to prevent program disturb. In one method known as "self boosting," the unselected bit lines are electrically isolated and a pass voltage (e.g., 10 V) is applied to the unselected word lines during programming. The unselected word lines couple to the channel of inhibited NAND string 203, causing a voltage (e.g., 8 V) to exist in the channel of the of that string at least under the selected word line, which tends to reduce program disturb. Thus, self boosting causes a voltage boost to exist in the channel which tends to lower the voltage across the tunnel oxide and hence reduce program disturb.

A NAND string is typically (but not always) programmed from the source side to the drain side, for example, from storage element 228 to storage element 222. For example, assume the NAND string 203 is programmed before the NAND string 201. When the programming process is ready to program the last (or near the last) storage element of the NAND string 201, if all or most of the previously programmed storage elements on the NAND string being inhibited (e.g., NAND string 203) were programmed, then there is negative charge in the floating gates of the previously programmed storage elements. As a result, the boosting potential does not get high enough in portions of the NAND string 203 and there still may be program disturb on the elements in the NAND string 203 associated with the last few word lines. For example, when programming element 222 on NAND string 201, if elements 248, 246 and 244 on NAND string 203 were previously programmed, then each of those transistors (244, 246 and 248) have a negative charge on their floating gate which will limit the boosting level of the self boosting process and possibly cause program disturb on element 242.

Local Self Boosting ("LSB") and Erased Area Self Boosting ("EASB") attempt to address the shortcomings of conventional self boosting by isolating the channel of previously programmed elements from the channel of the element being inhibited. For example, if element 224 of FIG. 4 is being programmed, LSB and EASB attempt to inhibit programming in element 244 by isolating the channel of element 244 from the previously programmed elements (246 and 248). With the LSB technique, the bit line for the element being programmed is at ground and the bit line of the NAND string with the element being inhibited is at $V_{dd}$. The program voltage $V_{pgm}$ (e.g., 20 volts) is driven on the selected word line. The word lines neighboring the selected word line are at zero volts and the remaining non-selected word lines are at $V_{PASS}$. For example, bit line 202 is at zero volts and bit line 204 is at $V_{dd}$. Drain select SGD is at $V_{dd}$ and source select SGS is at zero volts. Selected word line WL2 (for programming element 224) is at $V_{pgm}$. Neighboring word lines WL1 and WL3 are at zero volts, and other word lines (e.g., WL0) are at $V_{PASS}$.

EASB is similar to LSB with the exception that only the source side neighbor word line is at zero volts. The drain side neighbor word line is at $V_{PASS}$. If $V_{PASS}$ is too low, boosting in the channel will be insufficient to prevent program disturb. If $V_{PASS}$ is too high, unselected word lines will be programmed. For example, WL1 would be at zero volts instead of $V_{PASS}$, while WL3 would be at $V_{PASS}$. In one embodiment, $V_{PASS}$ is 7-10 V.

While LSB and EASB provide an improvement over self boosting, they also present a problem that depends on whether the source side neighbor element (element 246 is the source side neighbor of element 244) is programmed or erased. If the source side neighbor element is programmed, then there is a negative charge on its floating gate. Moreover, with zero volts applied to the control gate, there is a highly reverse biased junction under the negatively charged gate which can cause Gate Induced Drain Leakage (GIDL), in which electrons leak into the boosted channel. GIDL occurs with a large bias in the junction and a low or negative gate voltage, which is precisely the case when the source side neighbor element is programmed and the drain junction is boosted. GIDL causes the boosted voltage to leak away prematurely, resulting in a programming error, and is more severe with the abruptly and highly doped junctions, which are required as element dimensions are scaled. If the leakage current is high enough, the boosting potential in the channel region will decrease possibly resulting in program disturb. Furthermore, the closer the word line being programmed is to the drain, the less charge is present in the boosted junction. Thus, the voltage in the boosted junction will drop quickly, causing program disturb.

If the source side neighbor storage element is erased, then there is positive charge on the floating gate and the threshold voltage of the transistor will likely be negative. The transistor may not turn off even when zero volts are applied to the word line. If the storage element is on, then the NAND string is not operating in EASB mode. Rather, that NAND string is operating in self boosting mode, which has the problems discussed above. This scenario is most likely if other source side elements are programmed, which limits source side boosting. This issue is most problematic with shorter channel lengths.

Figure 5:
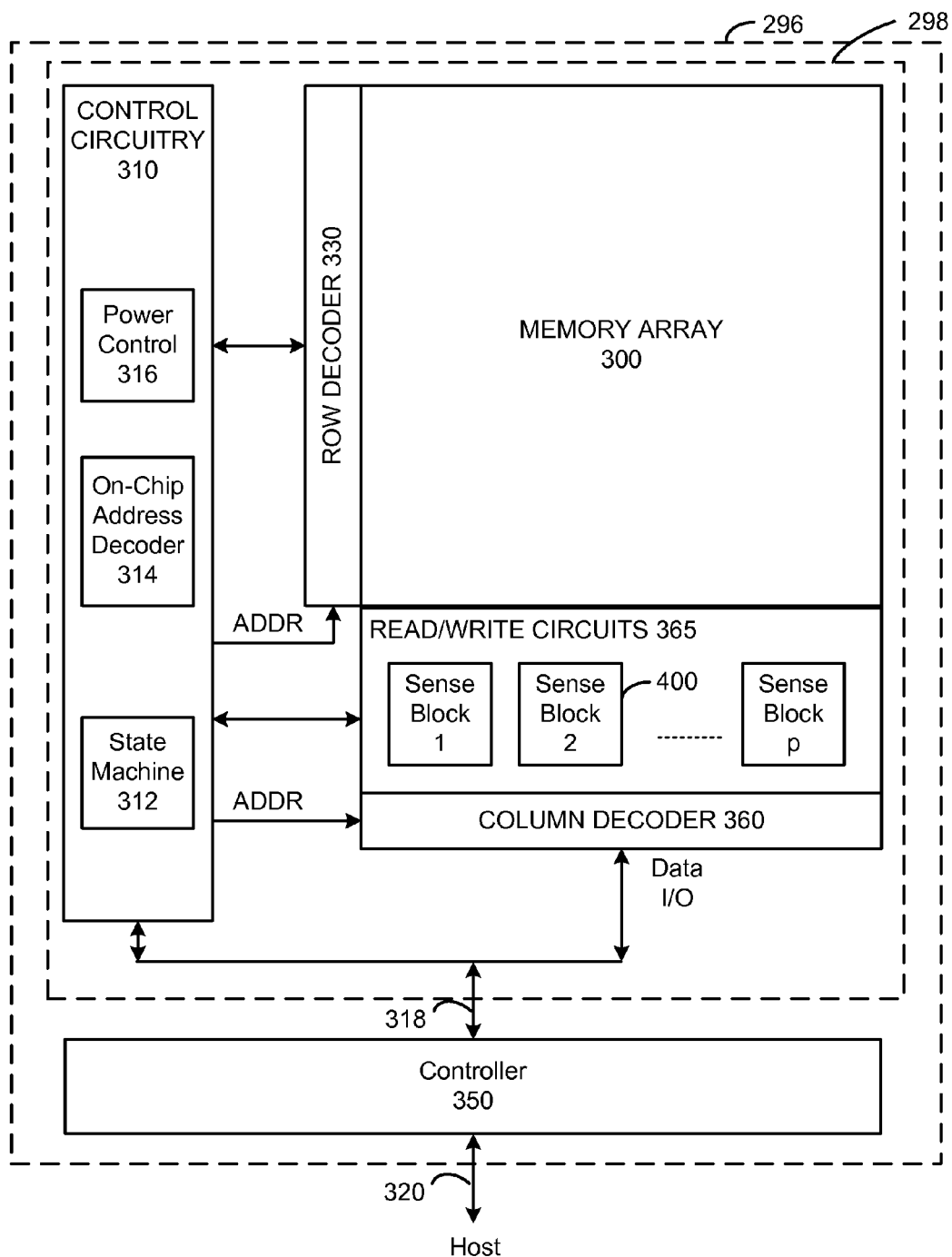
FIG. 5 is a block diagram of a non-volatile memory system.

FIG. 5 illustrates a memory device 296 having read/write circuits for reading and programming a page of memory cells in parallel, according to one embodiment of the present invention. The memory device 296 may include one or more memory die 298. The memory die 298 includes a two-dimensional array of memory cells 300, control circuitry 310, and read/write circuits 365. The memory array 300 is addressable by word lines via a row decoder 330 and by bit lines via a column decoder 360. The read/write circuits 365 include multiple sense blocks 400 and allow a page of memory cells to be read or programmed in parallel. Typically, a controller 350 is included in the same memory device 296 (e.g., a removable storage card) as the one or more memory die 298. Commands and data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In another approach, access to the memory array 300 by the various peripheral circuits is implemented in a symmetric fashion, on opposite sides of the array, so that the densities of access lines and circuitry on each side are reduced by half.

Figure 6:
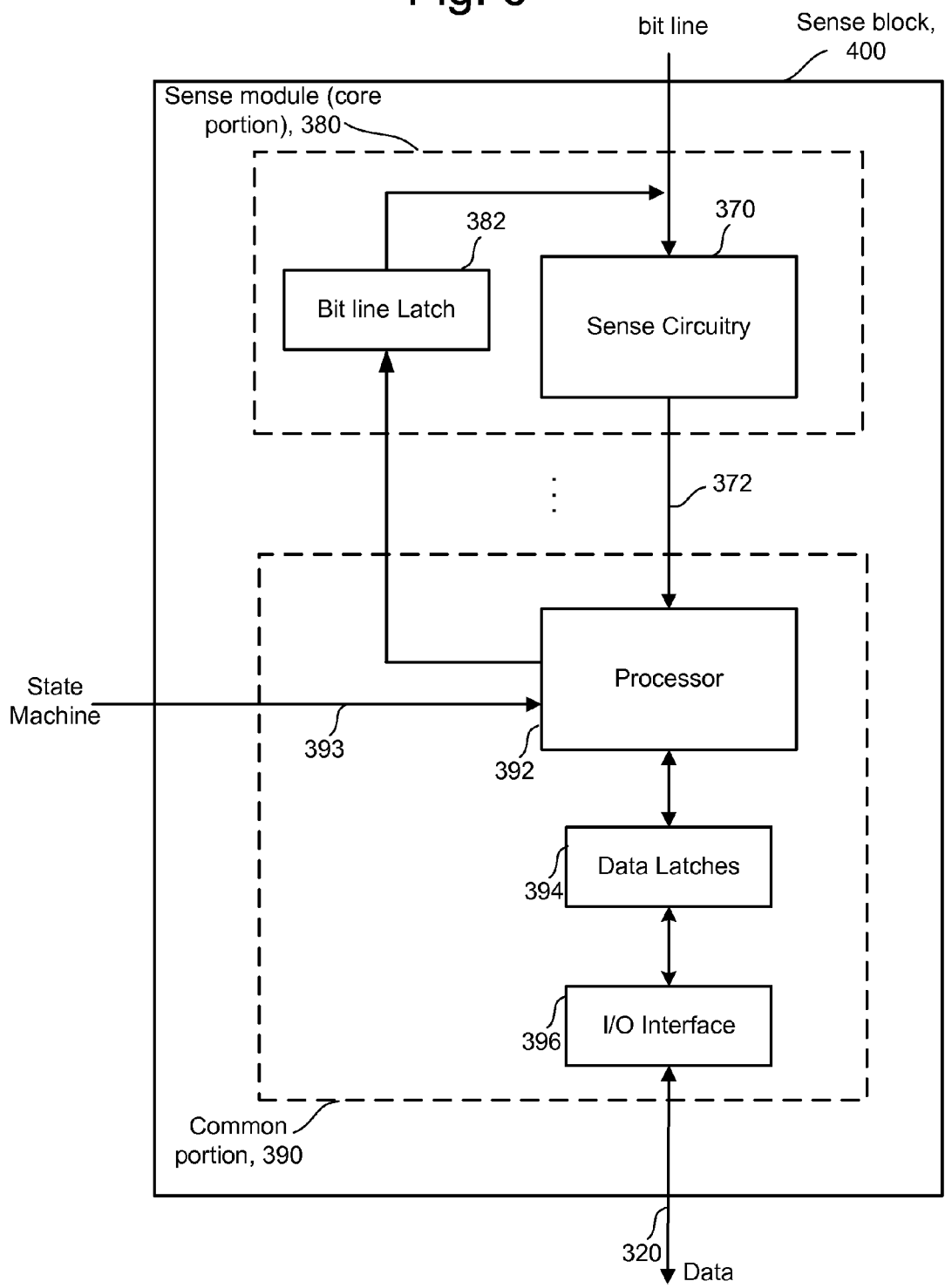
FIG. 6 is a block diagram depicting a sense block of the non-volatile memory system of FIG. 5.

FIG. 6 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block can include one common portion 390 and eight sense modules 380. Each of the sense modules in a group communicates with the associated common portion via a data bus 372. For further details, refer to U.S. patent application Ser. No. 11/026,536 "Non-Volatile Memory & Method with Shared Processing for an Aggregate of Sense Amplifiers", filed on Dec. 29, 2004, published as U.S. 2006/0140007 on Jun. 29, 2006, incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., $V_{dd}$).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 398 provides an interface between data latches 394 and the data bus 320.

During read or sensing, the operation of the system is under the control of state machine 312 that controls the supply of different control gate voltages to the addressed cell. As it steps through the various predefined control gate voltages corresponding to the various memory states supported by the memory, the sense module 380 will trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

Some implementations may include multiple processors 392. In one embodiment, each processor 392 can include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic can be added to processor 392 to accumulate the results of the associated bit lines such that the state machine need only read the wired-OR line one time. Similarly, by choosing the logic levels correctly, the global state machine can detect when the first bit changes its state and change the algorithms accordingly.

During programming or verification, the data to be programmed is stored in the set of data latches 394 from the data bus 320. The program operation, under the control of the state machine, comprises a series of programming voltage pulses applied to the control gates of the addressed memory cells. Each programming pulse can be followed by a read back (verify) to determine if the cell has been programmed to the desired memory state. As discussed further below, adaptive or "smart verify" techniques can be used to reduce the number of verify steps so that verification begins at specified times for specified storage elements. Processor 392 monitors the read back memory state relative to the desired memory state. When the two are in agreement, the processor 392 sets the bit line latch 382 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

An additional description of the operation of the sense module 380 has been provided in co-pending U.S. patent application Ser. No. 10/254,830, "Non-Volatile Memory And Method With Reduced Source Line Bias Errors," filed on Sep. 24, 2002, by Raul-Adrian Cernea and Yan Li, published on Mar. 25, 2004 as U.S. 2004/0057287, issued as U.S. Pat. No. 7,196,931 on Mar. 27, 2007; and U.S. patent application Ser. No. 10/665,828, "Non-Volatile Memory And Method with Improved Sensing," filed on Sep. 17, 2003, by Raul-Adrian Cernea and Yan Li, published on Jun. 10, 2004 as U.S. 2004/0109357, issued as U.S. Pat. No. 7,023,736 on Apr. 4, 2006. A description of the circuitry used to process the results of sense module 380 has been provided in co-pending U.S. patent application Ser. No. 11/026,536 entitled "Non-Volatile Memory and Method with Shared Processing for an Aggregate of Read/Write Circuits," filed on Dec. 29, 2004 by Raul-Adrian Cernea, Yan Li, Shahzad Khalid, and Siu Lung Chan, published as U.S. 2006/0140007 on Jun. 29, 2006, and in co-pending U.S. patent application Ser. No. 11/097,517 entitled "Use of Data Latches in Multi-Phase Programming of Non-Volatile Memories," filed on Apr. 1, 2005 by Yan Li and Raul-Adrian Cernea, issued as U.S. Pat. No. 7,158,421 on Jan. 2, 2007. The entire disclosures of these four referenced publications and patents are incorporated herein by reference.

Figure 7:
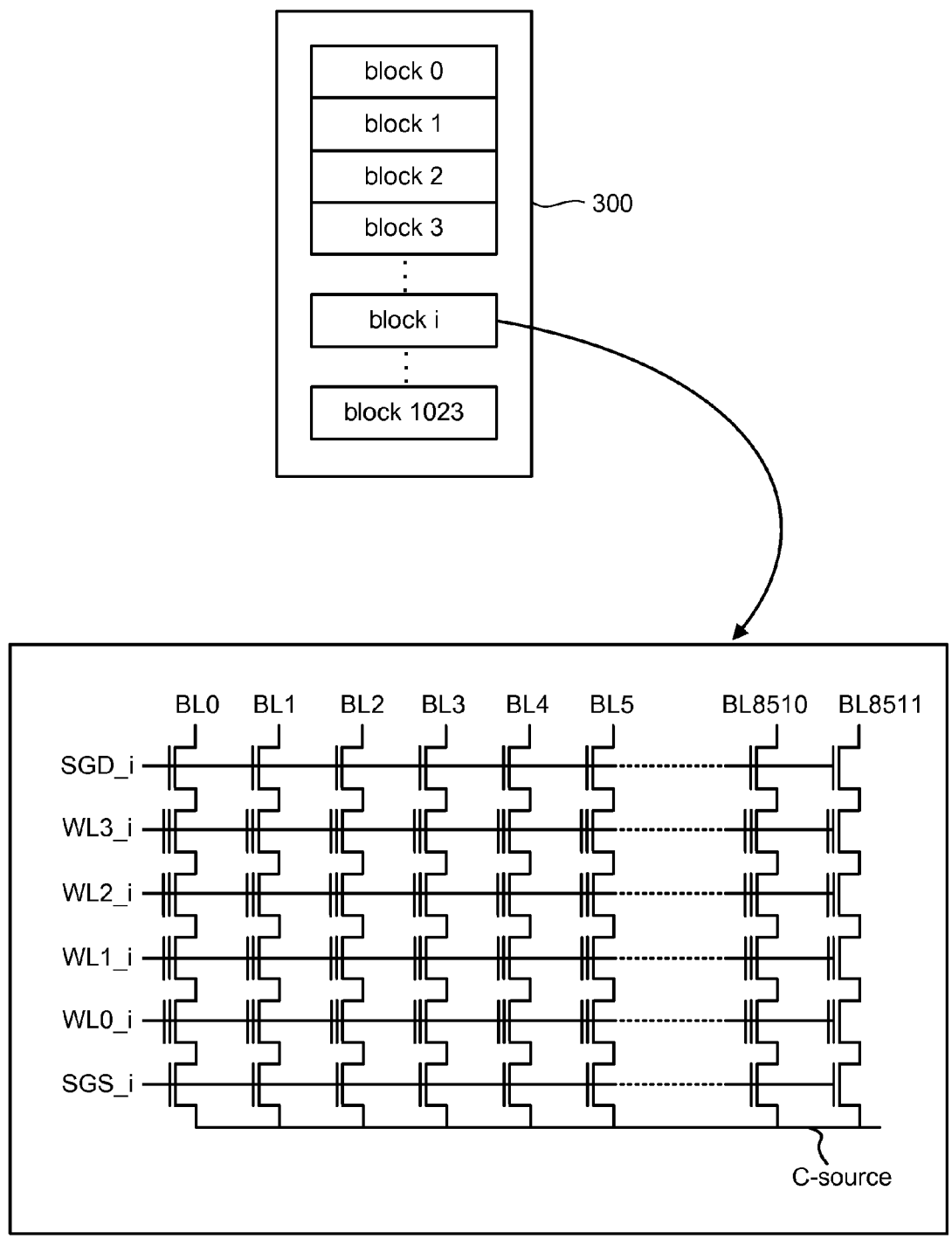
FIG. 7 is a block diagram of a non-volatile memory array.

FIG. 7 provides an example structure of storage element array 300. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns and corresponding bit lines, denoted by BL0-BL8511. Four storage elements are connected in series to form a NAND string. Although four elements are shown to be included in each NAND string, more or less than four storage elements can be used. One terminal of the NAND string is connected to a corresponding bit line via a select transistor SGD, and another terminal is connected to the c-source line via a second select transistor SGS.

During one configuration of read and programming operations, all 8,512 storage elements which have the same word line are simultaneously selected. Therefore, 1,064 bytes of data, which form a logical page, can be read or programmed simultaneously, and one block of the memory can store at least eight logical pages. For multi-state storage elements, when each storage element stores two bits of data, where each of these two bits are stored in a different page, one block stores sixteen logical pages. Two programming cycles can be used to program the storage elements, first with the data of the one page, then with the data of the other page. Other sized blocks and pages can also be used with the present invention. Additionally, architectures other than those illustrated can be used to implement the present invention. For example, in one design, the bit lines are divided into odd and even bit lines which are programmed and read separately.

Storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device, such as word lines, pages or sectors. Electrons are transferred from the floating gate to the p-well region so that the threshold voltage becomes negative, in one possible approach.

In the read and verify operations, the select gates (SGD and SGS) and the unselected word lines (e.g., WL0, WL2 and WL3, when WL1 is the selected word line) are raised to a read pass voltage (e.g., 4.5 V) to make the transistors operate as pass gates. The selected word line WL1 is connected to a voltage, a level of which is specified for each read and verify operation in order to determine whether a threshold voltage of the concerned storage element is above or below such level. For example, in a read operation for a two-level storage element, the selected word line WL1 may be grounded, so that it is detected whether the threshold voltage is higher than 0 V. In a verify operation for a two level storage element, the selected word line WL1 is connected to 0.8 V, for example, so that it is verified whether or not the threshold voltage has reached at least 0.8 V. The source and p-well are at 0 V. The selected bit lines are pre-charged to a level of, for example, 0.7 V. If the threshold voltage is higher than the read or verify level on the word line, the potential level of the bit line associated with the element of interest maintains the high level because of the non-conductive storage element. On the other hand, if the threshold voltage is lower than the read or verify level, the potential level of the concerned bit line decreases to a low level, for example, less than 0.5 V, because the conductive storage element discharges the bitline. The state of the storage element can thereby be detected by a voltage comparator sense amplifier that is connected to the bit line. Another type of sensing, all bit line (ABL) sensing, involves current sensing.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of storage elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16-20 bytes. A large number of pages form a block that includes, e.g., 8, 32, 64 or more pages.

Figure 8:
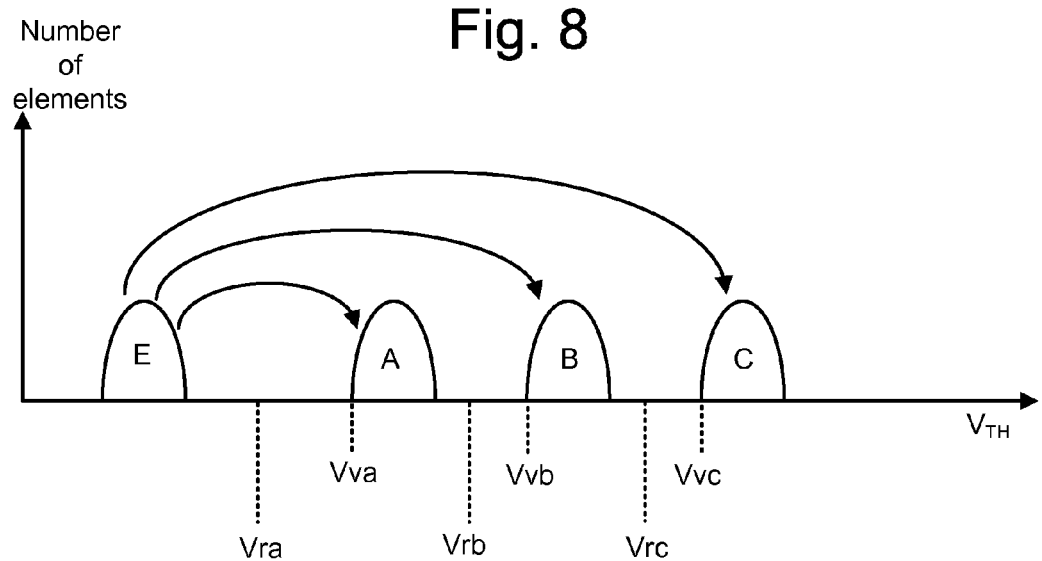
FIG. 8 depicts an example set of threshold voltage distributions in a multi-state device with direct programming from the erased state to a programmed state.

FIG. 8 illustrates threshold voltage distributions for a storage element array when each storage element stores two bits of data. E depicts a first threshold voltage distribution for erased storage elements. A, B and C depict three threshold voltage distributions for programmed storage elements. In one design, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the element depends upon the data encoding scheme adopted for the elements. One example assigns "11" to the threshold voltage range E (state E), "10" to the threshold voltage range A (state A), "00" to the threshold voltage range B (state B) and "01" to the threshold voltage range C (state C). However, in other designs, other schemes are used.

Three read reference voltages, Vra, Vrb and Vrc, are used for reading data from storage elements. By testing whether the threshold voltage of a given storage element is above or below Vra, Vrb and Vrc, the system can determine the state of the storage element. Three verify reference voltages, Vva, Vvb and Vvc are also indicated. When programming storage elements to state A, B or C, the system will test whether those storage elements have a threshold voltage greater than or equal to the Vva, Vvb or Vvc, respectively.

In one approach, known as full sequence programming, storage elements can be programmed from the erased state E directly to any of the programmed states A, B or C, as depicted by the curved arrows. For example, a population of storage elements to be programmed may first be erased so that all storage elements in the population are in the erased state E. While some storage elements are being programmed from state E to state A, other storage elements are being programmed from state E to state B and/or from state E to state C.

Figure 9:
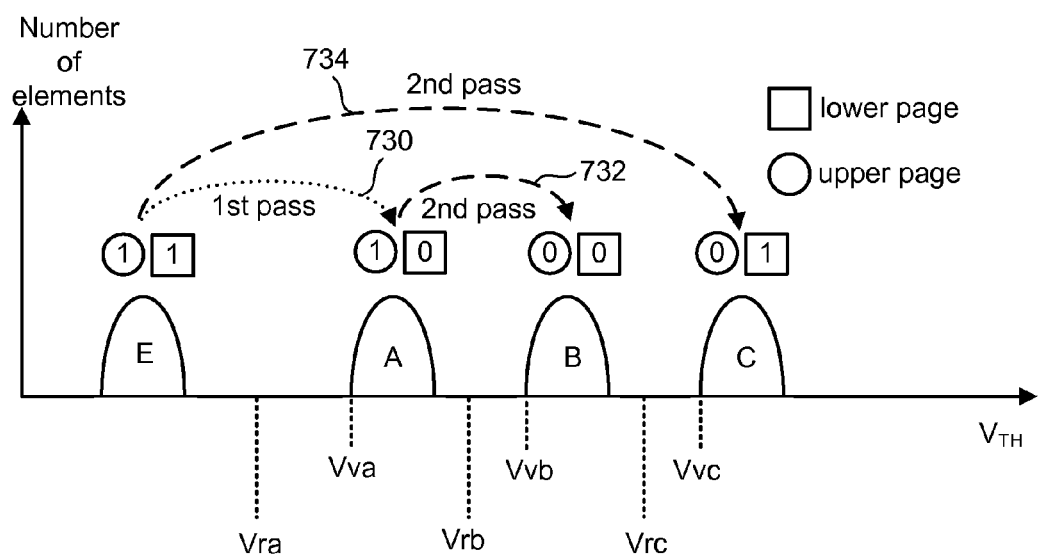
FIG. 9 depicts an example set of threshold voltage distributions in a multi-state device with two-pass programming from the erased state to a programmed state.

FIG. 9 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the element's threshold voltage level is set according to the bit to be programmed into the lower logical page. If that bit is a logic "1," the threshold voltage is not changed since it is in the appropriate state as a result of having been previously erased. However, if the bit to be programmed is a logic "0," the threshold level of the element is increased to be state A, as shown by arrow 730. That concludes the first programming pass.

In a second programming pass, the element's threshold voltage level is set according to the bit being programmed into the upper logical page. If the upper logical page bit is to store a logic "1," then no programming occurs since the element is in one of the states E or A, depending upon the programming of the lower page bit, both of which carry an upper page bit of "1." If the upper page bit is to be a logic "0," then the threshold voltage is shifted. If the first pass resulted in the element remaining in the erased state E, then, in the second phase, the element is programmed so that the threshold voltage is increased to be within state C, as depicted by arrow 734. If the element had been programmed into state A as a result of the first programming pass, then the storage element is further programmed in the second pass so that the threshold voltage is increased to be within state B, as depicted by arrow 732. The result of the second pass is to program the element into the state designated to store a logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's storage elements. More details of such an approach are disclosed in U.S. patent application Ser. No. 11/013,125, titled "Pipelined Programming of Non-Volatile Memories Using Early Data," filed on Dec. 14, 2004 by inventors Sergy A. Gorobets and Yan Li, issued as U.S. Pat. No. 7,120,051 on Oct. 10, 2006, and incorporated herein by reference in its entirety.

Figure 10A:
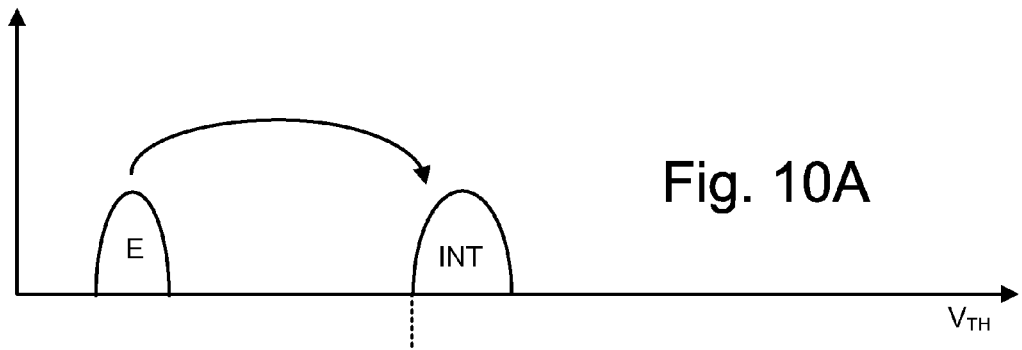
FIGS. 10A-C show various threshold voltage distributions and describe a process for programming non-volatile memory.
Figure 10B:
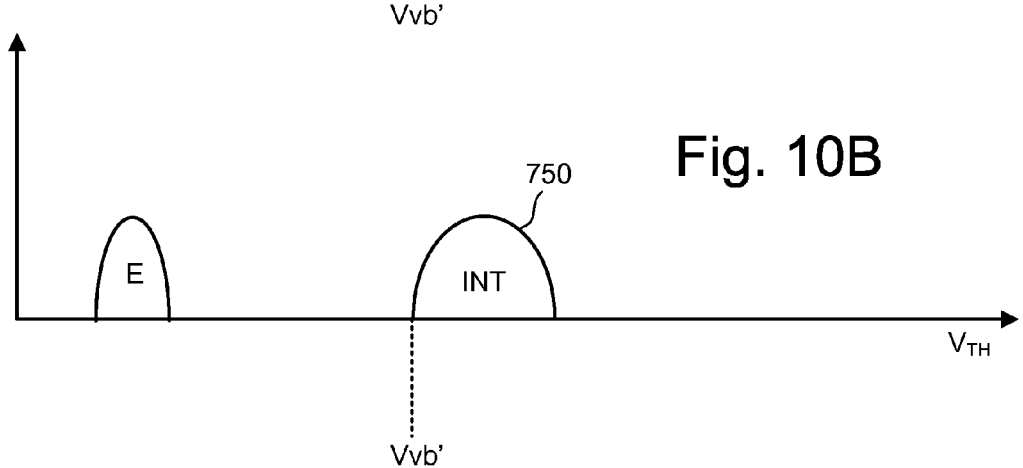
Figure 10C:
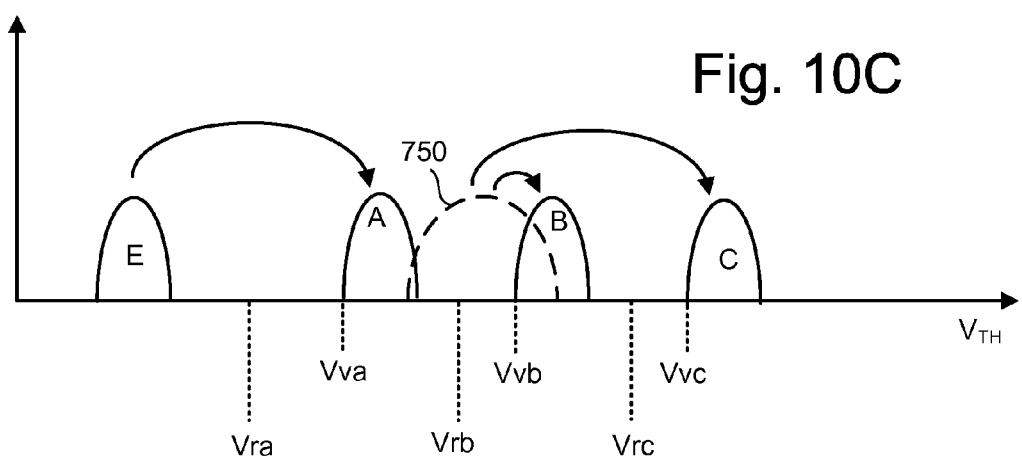

FIGS. 10A-C depict another process for programming non-volatile memory that reduces floating gate-to-floating gate coupling by, for any particular storage element, writing to that particular storage element with respect to a particular page subsequent to writing to adjacent storage elements for previous pages. In one example implementation, each of the non-volatile storage elements store two bits of data, using four data states which are represented by the different voltage distributions. For example, assume that state E is the erased state and states A, B and C are the programmed states. Each of the states E, A, B and C represent binary data states. For example, state E stores data 11, state A stores data 01, state B stores data 00 and state C stores data 10. This is an example of Gray coding because only one bit changes between adjacent states. Other encodings of data to physical data states can also be used. Each storage element stores bits from two pages of data. For reference purposes these pages of data will be called upper page and lower page; however, they can be given other labels. For state A, the lower page stores bit 1 and the upper page stores bit 0. For state B, both pages store bit data 0. For state C, the lower page stores bit 0 and the upper page stores bit 1. The programming process has two steps. In the first step, the lower page is programmed. If the lower page is to remain data 1, then the storage element state remains at state E. If the data is to be programmed to 0, then the voltage threshold $V_{TH}$ of the storage element is raised such that the storage element is programmed to an intermediate or interim state INT. FIG. 10A therefore shows the programming of storage elements from state E to state INT. State INT represents an interim state; therefore, the verify point is depicted as Vvb', which could be as low as Vva, and which is lower than Vvb, depicted in FIG. 10C.

In one design, after a storage element is programmed from state E to state INT, its neighbor storage element on an adjacent word line is programmed with respect to its lower page. After programming the neighbor storage element, the floating gate-to-floating gate coupling effect will raise the apparent threshold voltage of storage element under consideration, which is in state INT. This will have the effect of widening the threshold voltage distribution for state INT to that depicted as threshold voltage distribution 750 in FIG. 10B. This apparent widening of the threshold voltage distribution will be remedied when programming the upper page, in a subsequent programming step.

FIG. 10C depicts the process of programming the upper page. If the storage element is in the erased state E and the upper page is to remain at 1, then the storage element will remain in state E. If the storage element is in state E and its upper page data is to be programmed to 0, the threshold voltage of the storage element will be raised so that the storage element transitions to state A. If the storage element is in state INT 750 (lower page is "0") with the intermediate threshold voltage distribution 750 and the upper page data is to become data 0, the threshold voltage of the storage element will be raised, if necessary, so that the storage element is in state B. Typically, states INT and B will overlap so that some of the storage elements in state INT will also be in state B. For these storage elements, no additional programming is needed to transition to state B. For the storage elements that are in state INT but not in state B, additional programming is needed to transition them to state B. Further, if the storage element is in state INT with the intermediate threshold voltage distribution 750 and the upper page data is to be programmed to 1, the storage element will be programmed to final state C. Specifically, these elements will transition from state INT, either outside state B or overlapping with state B, to state C.

The process depicted reduces the effect of floating gate-to-floating gate coupling because only the upper page programming of neighbor storage elements will have an effect on the apparent threshold voltage of a given storage element. An example of an alternative state coding is: state E stores data 11, state A stores data 01, state B stores data "10" and state C stores data "00", forming a new LM code. Although FIGS. 10A-C provide an example with respect to four data states and two pages of data, the concepts taught can be applied to other implementations with more or less than four states and different than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005, issued as U.S. Pat. No. 7,196,928 on Mar. 27, 2007.

Smart Verification

The starting point for initiating verification while programming non-volatile storage is conventionally fixed by a parameter determined by device engineers and referred to in some cases as a ROM fuse parameter. The starting point takes into account a worst case scenario for cycled parts, which program more quickly than fresh parts due to oxide trapping or defects in the oxide of the storage elements after many programming pulses have been applied. The parameter settings are typically set to guarantee that cycled parts will not become over programmed.

However, with these settings a fresh device which programs more slowly will undergo many programming and program verify pulses before any bits become sufficiently programmed to pass the verify level and be locked out from receiving further programming pulses. Inefficiencies therefore result, including increased programming time and power consumption.

FIG. 11 depicts a time sequence of events in programming non-volatile storage elements using sequential programming while adaptively determining when program verification should begin. The smart verify process overcomes many of the inefficiencies when using fixed parameters to control the starting point of the program verification processes. Instead, the smart verify process determines the starting point of each verify process for each page independently, according to the speed of programming in that page. For example a storage element will be programmed from the erase state E directly to any of the states A, B or C (see FIG. 8). In FIG. 11, the time sequence includes time points $t_S$, $t_0$, $t_1$, $t_2$, $t_3$, $t_4$, $t_5$, $t_6$ and $t_7$. The amplitude of the programming pulses, $V_{pgm}$, which are applied to the storage elements, is indicated at the different time points, along with the verification or verify pulses between programming pulses, which are of lower magnitude. Note that one verify pulse for each state which is to be verified is applied between each program pulse. For example, one verify pulse is applied when only the A elements are being verified, while two pulses are applied when the A and B elements, or the B and C elements, are being verified.

The starting point of verify A, e.g., verification of a storage element in state A, can be determined by a ROM fuse parameter $N_A$, the number of programming pulses after the start of programming tS. In some embodiments NA may be zero and verification begins after the first programming pulse. Immediately after or as a part of each program verify A pulse, a detection process is performed to check if any storage elements selected for programming pass the verify A level (Vva in FIGS. 8-10), regardless of their targeted programmed state. After at least one bit has been detected in state A, a corresponding internal signal, PCVA_FLAG, goes high at t1. The starting point for verify B, $t_2$, can then be determined by counting a specified number of program pulses NB after $t_1$. An appropriate value for NB can be estimated based on the voltage difference between verify A and B levels divided by the program wordline voltage step size (the difference in amplitude between consecutive programming pulses), and stored as a ROM fuse parameter. At $t_3$ when another internal signal, PCVB_FLAG, rises it indicates that at least one bit has passed the verify B level regardless of its targeted program state. The starting point of verify C, t5, can be determined by counting a specified number of program pulses, NC after $t_3$. An appropriate value for $N_C$ can be estimated based on the voltage difference between verify B and C levels divided by the program wordline voltage step size and stored as a ROM fuse parameter. Time points $t_4$, $t_6$ and $t_7$ indicate when verification at the A, B and C levels, respectively, has been completed. The special case where there is no state A data and consequently internal signal PCVA_FLAG never rises, is detected at the start of programming and another ROM fuse parameter, PCVB_ROM, dedicated specifically for this purpose can be used to determine the starting point for state B verification. Similarly if there is no state B data, yet another dedicated ROM fuse parameter, PCVC_ROM, can be used to determine the starting point for state C verification.

Figure 12A:
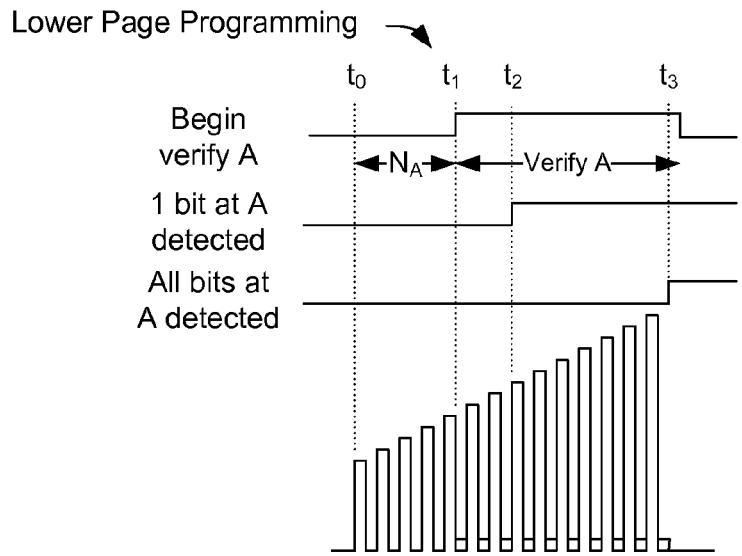
FIGS. 12A and 12B depict a time sequence of events in programming non-volatile storage elements using a two pass (lower page/upper page) programming sequence while adaptively determining when program verification should begin.
Figure 12B:
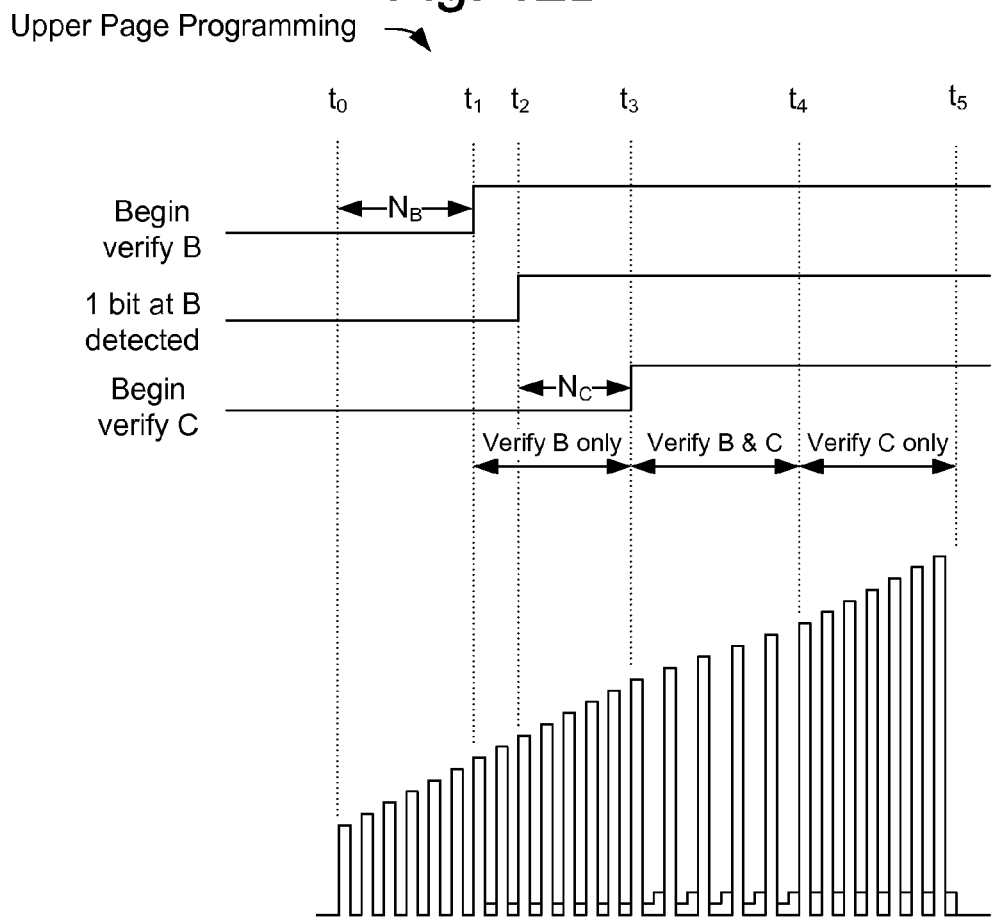

FIGS. 12A and 12B depict a time sequence of events in programming non-volatile storage elements using a two pass (lower page/upper page) programming sequence while adaptively determining when program verification should begin. When following the two pass programming method of FIG. 9, during the first pass, programming occurs only from the erased state E to state A. In FIG. 12A only NA, which signals the start of verify A, is used. During the second pass, when programming the upper page, state B is programmed from state A and state C is programmed from state E. Since there is no state A data during this programming cycle, PCVB_ROM is used to start the verification, and the starting point for state C verification, t3, may be determined using a smart verification process. With reference to FIG. 12B, programming starts at t0 with no verify pulses between programming pulses and only verify B occurs between t1 and t3.

When programming according to the method of FIGS. 10A-C, during the second pass storage elements in state INT can be programmed to states B and C at the same time, e.g., in the same programming cycle in which a series of program pulses are applied to the storage elements. Furthermore, state B overlaps with state INT. In these and other cases, discussed below, the verification of elements that are programmed to higher state C from state INT can be adaptively initiated based on when other elements have been programmed to a lower state, e.g., state B from state INT. The technique is broadly applicable as will be apparent to those skilled in the art.

After the lower page has been programmed, any bits to be programmed to states B or C will have their threshold voltages within the INT distribution 750. During a subsequent upper page programming, state A will be programmed from state E, and states B and C will be programmed from the INT state. However, in this case the detection of at least one bit passing verify A can be confused with bits already in the INT state. This may occur because conventional sensing simply determines that there are bits with thresholds above VVA and thus bits already in the INT state will be sensed as well as new bits just entering state A. One way to overcome this problem is to detect the movement of only the bits moving from state E to state A. This can be done by choosing bits to be programmed to state A only and disregarding bits already in the INT state which will be programmed to higher states such as B and C. Before verify A, only the bitlines with program data A will be charged up and sensed, so that the information of at least one bit passing verify A will be obtained from bits to be programmed to state A only. The determination of which bits to use for this purpose may be performed only once at the start of programming. The information thus obtained is used to determine the starting point of verify B in the same way as described previously, e.g., by skipping verify B for the next $N_B$ programming pulses. Alternately, which bits to use for monitoring when the first bit reaches state A may be determined after each programming pulse to avoid the need for dedicated latches to hold this information throughout the programming cycle. To this end, one or more managing circuits of the memory device can control the sense amplifiers associated with the storage elements which are to be programmed to state A to read the voltage thresholds of only those storage elements, while inhibiting all other sense amplifiers from reading the voltage threshold of other storage elements. Details of the circuitry necessary to accomplish this are contained in U.S. patent applications Ser. Nos. 11/026,536 and 11/097,517 referenced earlier.

In determining the starting point of verify C, the presence of bits already in the INT state causes the detection of at least one bit passing verify B to be problematic. There are different ways to resolve this problem. One approach is to determine the verify C starting point based on a one bit detection using only bits from state E that cross the program verify A threshold as described above. The implied assumption is that the change of threshold of these bits with each program pulse is constant and representative of those moving from the INT state to state C, and thus can be used to predict the behavior of the bits moving into state C. This is normally valid after a few programming pulses but "fast bits" moving out of state E may move faster than expected.

Figure 13A:
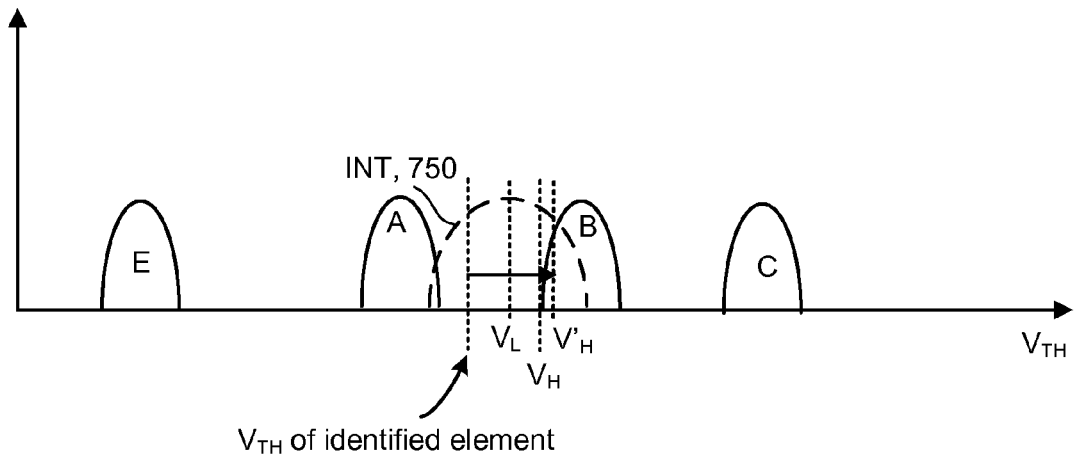
FIG. 13A describes a process for tracking a transition of a non-volatile storage element.

A preferred approach to determining the starting point to begin counting $N_C$ pulses is to detect a state B element passing the verify B level from the under programmed side as illustrated in FIG. 13A. INT distribution 750 is shown as overlapping state B such that some bits have thresholds above $V_H$ (equivalent to $V_{vb}$ in FIG. 10C), and thus are already in state B. Other bits, such as the ones with thresholds at Vi will move upon application of subsequent programming pulses until they exceed $V_H$. To detect the bits passing the verify B level, only the bits below the verify B level must be identified and monitored as they transition past the verify B level as additional programming pulses are applied. One way to choose these bits is to perform one special verify B at a threshold VL lower than the normal verify B level for all bitlines after at least one bit has passed the verify A level. After NA programming pulses in which only state A is being verified, a verify B is performed at the normal sense point $V_vB$ (represented in FIG. 13A as VH). The bits with thresholds less than $V_L$ are monitored to determine when one of them passes the $V_H$ level.

An alternative way of choosing the bits to determine when to start counting $N_C$ pulses is to choose all bits in the INT population below $V_H$ (rather than $V_L$) and monitor their movement across a slightly higher verify level V'H to ensure that any bits with a threshold slightly below VH really are moving and not simply detected due to noise associated with the sense amp. V'H could be 20 mV to 30 mV higher than VH. This approach may be preferred when $V_L$ is used for other purposes (such as coarse/fine programming) with its value determined by other considerations.

Figure 13B:
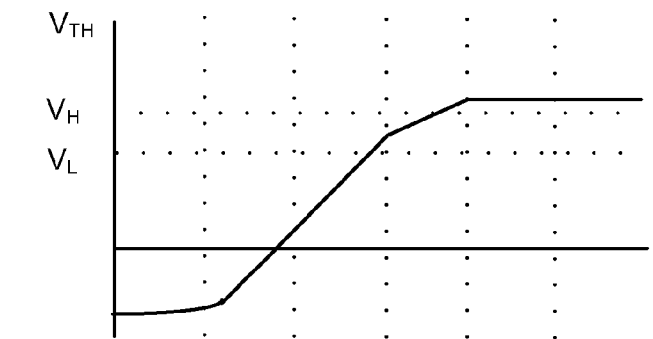
FIGS. 13B and 13C depict a time line showing how coarse and fine programming are achieved by setting a bit line inhibit voltage.
Figure 13C:
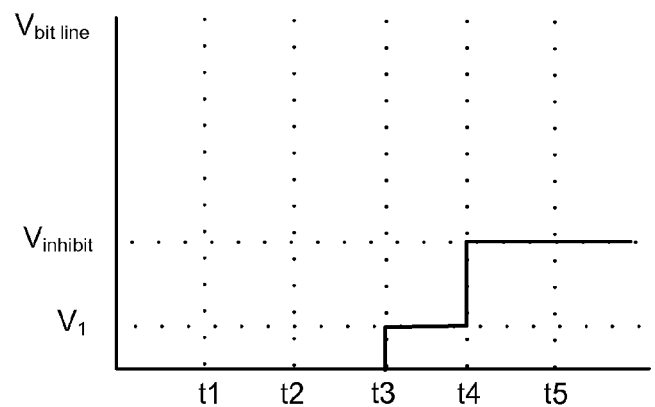

As shown in FIG. 13B, $V_L$ and $V_H$ can be chosen to implement a coarse/fine programming technique. FIG. 13B indicates a change in a storage element's threshold voltage with time, while FIG. 13C indicates a bit line voltage that is applied to the bit line associated with the storage element being programmed. Programming of a storage element can be slowed down by increasing its bit line voltage level, which counteracts the effect of the applied programming voltage pulses $V_{pgm}$. The magnitude of this voltage level, shown as $V_1$ in FIG. 13C, is typically in the range of 0.3 to 0.7 volts. This allows the threshold voltage of a storage element to increase to a desired level more quickly at first, during coarse programming, and then more slowly, during fine programming. Coarse programming occurs when the voltage threshold is below $V_L$, while fine programming occurs when the voltage threshold is between $V_L$ and $V_H$. The storage element is in an inhibit mode, locked out from further programming and verifying, when its voltage threshold level exceeds $V_H$. $V_L$ and $V_H$ need not be associated with the coarse/fine programming technique but can be chosen as otherwise appropriate values. Moreover, different $V_L$ and $V_H$ values can be associated with different states of a multi-state storage element, e.g., states A, B and C, to allow coarse/fine programming of the different states. This type of coarse/fine programming is described in U.S. Pat. No. 6,643,188, which is hereby incorporated by reference in its entirety.

In one approach where $V_L$ is used for coarse/fine programming, the special verify at VH is performed only once right after PCVA_FLG goes high. Only the bitlines with program data B will be selected for this verify. After this one time special verify the program-verify sequence continues using only verify A for the next $N_B$ cycles. After verify at state B is started, V'$_H$ verify level will be used until the one bit detection at state B is achieved. Using this special way of performing verify B, only the bits that were identified at the earlier special $V_H$ verify are monitored and used for a one bit detection to determine the PCVB_FLG signal indicating that one bit has passed the verify B level. This flag can then be used to predict the starting point to begin verify C. After PCVB_FLG is detected, a normal program verify B will be performed for the remaining state B storage elements which were not identified as having a threshold below VH, as explained when discussing FIG. 15 below. Once state B verification begins, each state B verification cycle will incorporate a verify at VL and a separate verify at $V_H$ (or V'$_H$). The verify with a wordline voltage of VL divides the bits to be programmed to state B but not yet in that state into two categories: those whose thresholds are below VL and which will receive full programming voltage during the next programming cycle, and those whose thresholds are between VL and $V_H$ (or V'$_H$) and receive a reduced programming voltage during the next programming cycle.

Figure 14:
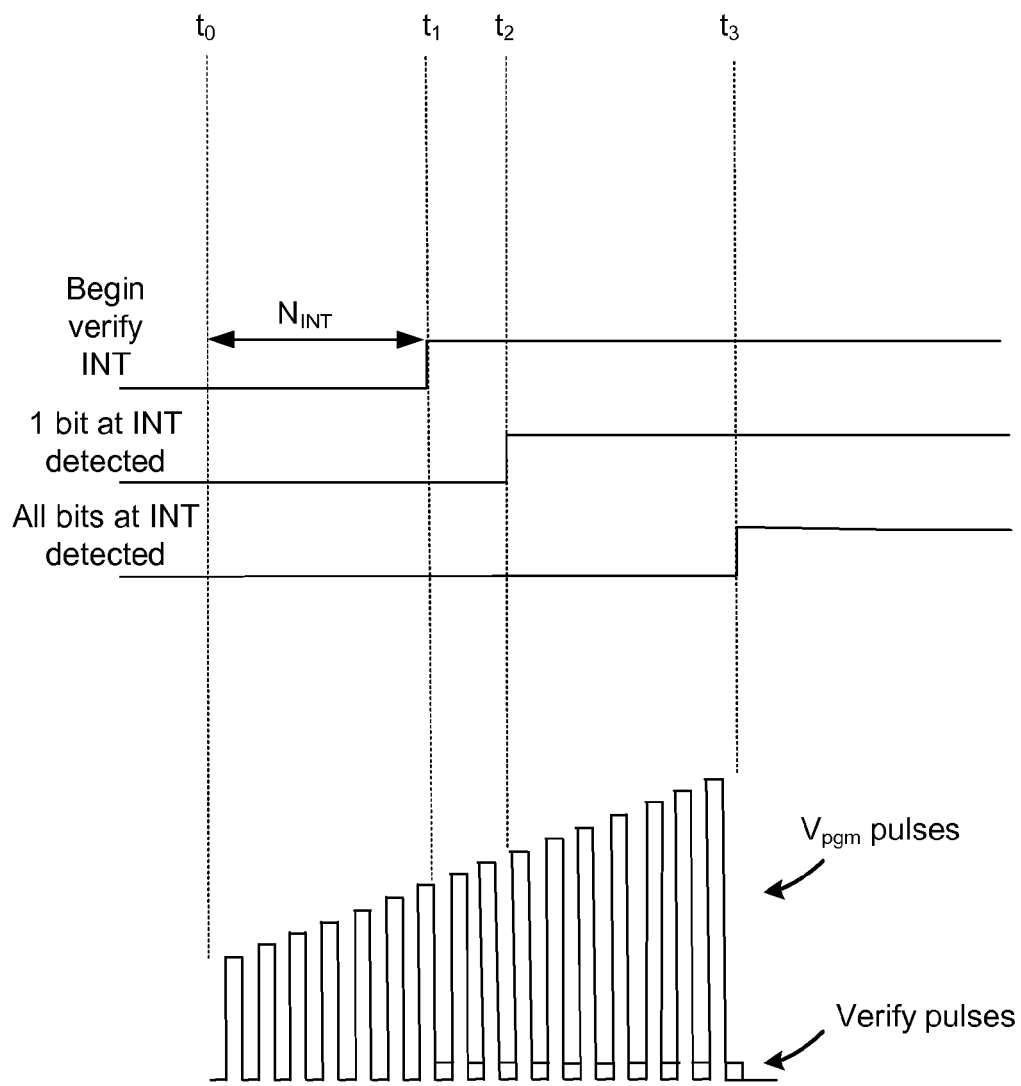
FIG. 14 depicts a time sequence of events in programming non-volatile storage elements using a lower page of data.

FIG. 14 depicts a time sequence of events in programming non-volatile storage elements using a lower page of data. Programming begins at $t_0$ by applying programming voltage pulses to the storage elements which are to be programmed to the INT state. After a number of pulses $N_{INT}$, verification begins at $t_1$ for the storage elements. At $t_2$, one of the bits is verified to have transitioned to the INT state from the erased state. At $t_3$, all of the bits of the storage elements which are to be programmed to the INT state have been verified to have reached that state, and programming of the lower page data is concluded.

FIG. 15 depicts a time sequence of events in programming non-volatile storage elements using an upper page of data subsequent to that occurring in FIG. 14. In an example, programming pulses are applied to the storage elements which are to be programmed to state A from state E, and to states B and C from the INT state. At $t_0$, verification of the storage elements to be programmed to the A state begins. The initial amplitude of the programming pulses is typically less than or the same as that used at the beginning of FIG. 14. Consequently the distribution of bits in the INT state are only minimally affected by these programming pulses because it took much higher pulse amplitudes for them to reach this state. At $t_1$, the first bit at state A is verified. Also, at $t_1$, storage elements which are to be programmed to state B, and which currently have a threshold below $V_H$ are identified by applying an additional special verification pulse. The identification of these storage elements, referred to as B<$V_H$ need not coincide with the verification of the first bit at state A but may occur generally before a storage element is expected to transition from the INT state to state B. After skipping $N_B$ programming pulses at $t_2$, the previously identified storage elements are tracked to determine when the first of these storage elements is verified to have transitioned to state B using V'$_H$ as the verify level. At this time, verification proceeds for the remainder of the storage elements which are being programmed to state B. Some of these storage elements may be in the portion of INT which overlaps with state B and therefore will verify immediately (or were locked out as part of the identification of B<VH). After skipping NC programming pulses, verification begins at t5 for the storage elements which are to be programmed to state C. Thus, the initiation of the verification of state C elements is adaptively set based on the determination of when state B elements have transitioned from below VH to V'H, or, generally, from a voltage threshold which is outside the state B distribution, within the INT distribution, to a voltage threshold in the state B distribution as determined using a sensing and/or noise margin level above V$_H$. Verification at the A, B and C levels has been completed at example time points $t_4$, $t_6$ and $t_7$, respectively.

In another possible approach (when the coarse/fine programming of FIG. 13C is not used), the first special verify B is at V$_H$ only, and bits that passed this verify level are locked out, as with the above-mentioned approach. After the verify B starting point, any bits passing from V$_L$ to V$_H$ are monitored to determine the one bit detection for judgments.

The techniques described can be applied to various other programming scenarios. For example, while multi-state storage elements having four binary data levels were discussed, storage elements having fewer or more data levels can be used. Moreover, programming need not occur using two pages of data, but can use fewer or additional pages, or a programming scheme which is not page-based.

Figure 16A:
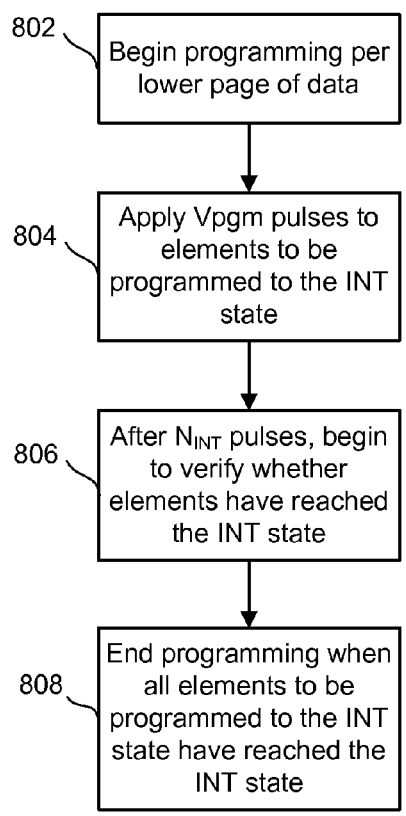
FIG. 16A provides a flow chart describing a process for programming non-volatile storage based on a lower page of data, using adaptive verification.
Figure 16B:
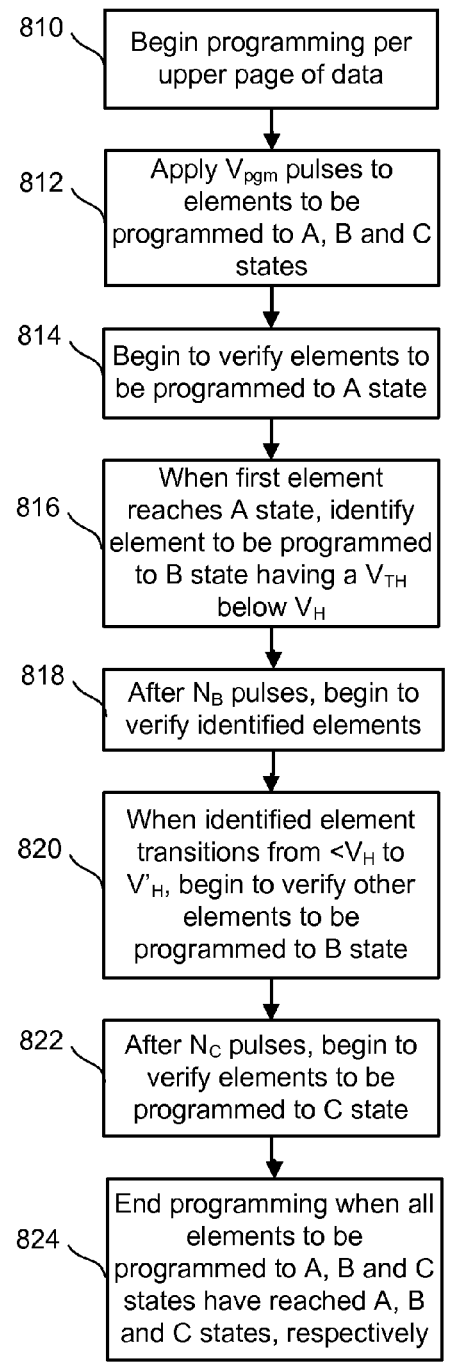
FIG. 16B provides a flow chart describing a process for programming non-volatile storage based on an upper page of data, using adaptive verification.

FIGS. 16A and 16B provide flow charts describing processes for programming non-volatile storage using adaptive verification. The processes can occur in parallel, for example, when different word lines are programmed based on different pages of data. Refer also to FIG. 14. In FIG. 16A, at step 802, programming begins according to a lower page of data, for instance. At step 804, programming (V$_{pgm}$) pulses are applied to the storage elements to be programmed to the INT state, in one example implementation. These are the elements that will subsequently be programmed to the B and C states. The lower page data is only 0 or 1, where 0 means programming occurs. At step 806, after N$_{INT}$ pulses, verification begins to determine whether the storage elements have reached the INT state. At step 808, programming ends when all elements to be programmed to the INT state have reached the INT state.

In FIG. 16B, at step 810, programming according to the upper page of data begins. Refer also to FIG. 15. At step 812, V$_{pgm}$ pulses are applied to the elements to be programmed to states A, B and C. At step 814, a verification begins for the storage elements to be programmed to state A. At step 816, when a first storage element reaches state A, an identification can be performed to identify one or more elements which are to be programmed to state B, and which currently have a voltage threshold V$_{TH}$ below V$_H$, which is the lower voltage threshold associated with state B. At step 818, after N$_B$ programming pulses, verification of the identified state B elements begins. At step 820, when one or more of the identified elements transitions from below V$_H$ to V'$_H$, verification is initiated for the other storage elements which are to be programmed to state B. At step 822, after N$_C$ programming pulses have been applied, verification begins for the elements to be programmed to state C. At step 824, programming ends when the storage elements to be programmed to states A, B and C have been verified to have reached the respective states.

Figure 17:
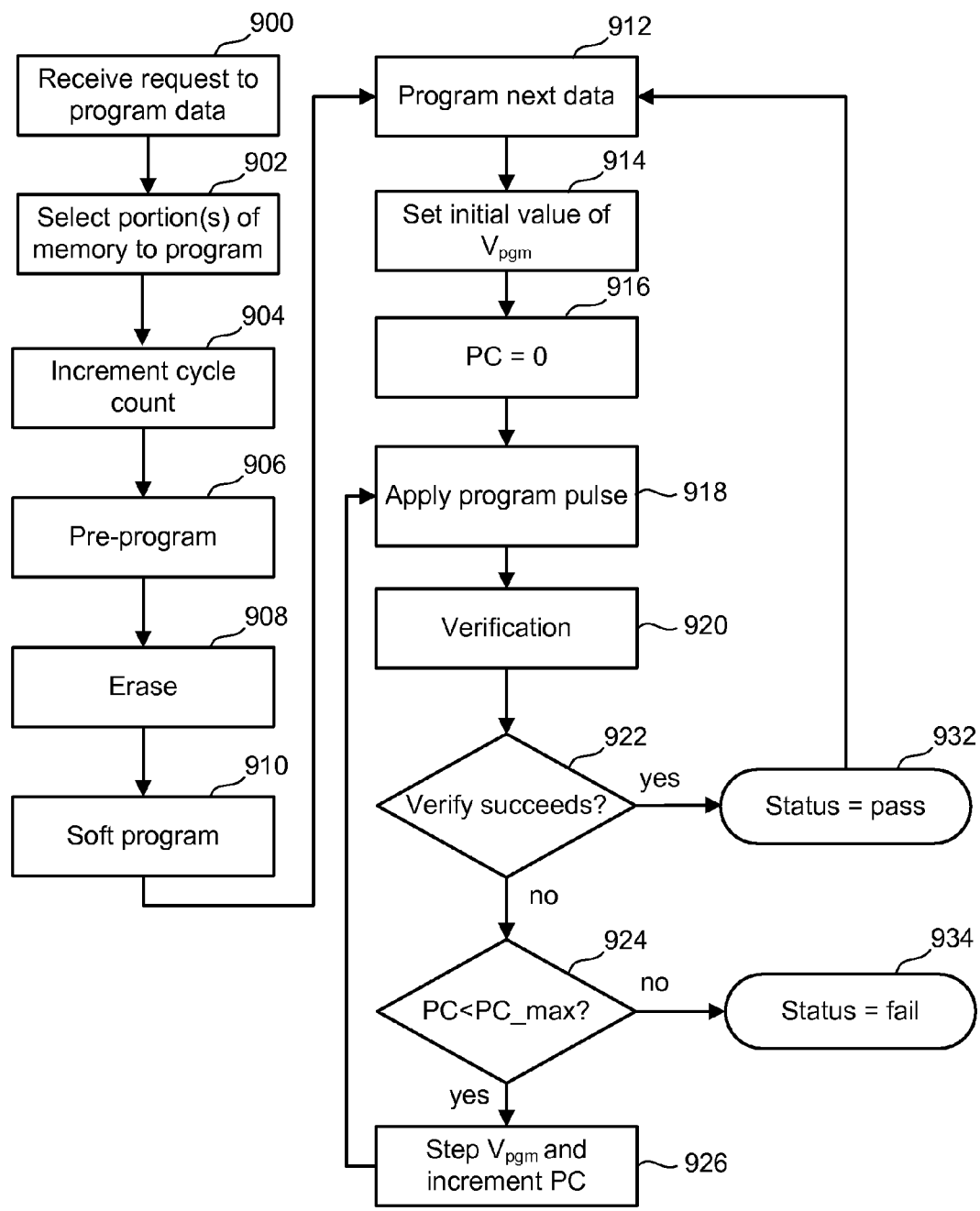
FIG. 17 provides a flow chart describing a process for programming non-volatile storage using lower and upper pages of data.

FIG. 17 provides a flow chart describing a process for programming non-volatile storage using lower and upper pages of data. The process of FIG. 16 can be incorporated into the process of FIG. 17. The process can be initiated in response to receiving a request to program data, as indicated at step 900. At step 902, appropriate portions of memory to program are selected. At step 904, a cycle count can be incremented. The cycle count, which is a count of the number of programming cycles, can be stored in the flash memory array, the state machine, the controller, or another location, to track the usage of the storage elements. In one embodiment, the cycle count is stored in a register associated with the state machine. At step 906, the selected portion of memory is optionally pre-programmed, which provides for even wearing of the flash memory. All storage elements in the chosen sector or page are programmed to the same threshold voltage range. At step 908, all the storage elements to be programmed are then erased. For example, this can include moving old storage elements to state E. At step 910, a soft programming process addresses the issue that, during the erase process, it is possible that some of the storage elements have their threshold voltages lowered to a value that is below the distribution E. The soft programming process applies program voltage pulses to the storage elements so that their threshold voltages will increase to be within threshold voltage distribution E. In other words, the over erased memory bits are programmed softly to tighten the erase populations.

At step 912, programming according to the next data begins. For example, the data may be from a lower or upper page. In step 914, the system sets the magnitude of the initial program pulse, e.g., by properly programming the charge pump. At step 916, the program count PC is initially set to zero. In step 918, a program pulse is applied to the appropriate word line(s). In step 920, the storage elements on that word line(s) are verified to see if they have reached the target threshold voltage level. If all the storage elements have reached the target threshold voltage level and the verify succeeds (step 922), a pass status is set (step 932) and programming of the next data begins at step 912. Additional programming and verification occurs as described. Once all storage elements have been verified to have been programmed based on the data, the programming process has completed successfully. The programming can proceed with sequential page numbers, page 0, 1, 2, 3, etc. until the all data has been programmed.

If not all the storage elements have been verified at step 922, then it is determined in step 924 whether the program count PC is less than a limit PC_max, such as twenty, or an adaptive limit that can be page-dependent, for instance. If the program count is not less than PC_max, then the programming process has failed (step 934). If the program count is less than PC_max, then in step 926, the magnitude of program voltage signal V$_{pgm}$ is incremented by the step size (e.g., 0.3 V) for the next pulse and the program count PC is incremented. Note that those storage elements that have reached their target threshold voltage are locked out of programming for the remainder of the current programming cycle. The process is repeated until a pass or fail status has been declared for each of the storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile storage, comprising:
    programming respective non-volatile storage elements in a set of non-volatile storage elements according to first data to have respective threshold voltages that fall within at least a first threshold voltage distribution;
    programming, according to second data, at least a first of the non-volatile storage elements that fell within the first threshold voltage distribution, but outside of a higher, second threshold voltage distribution which overlaps with the first threshold voltage distribution, to fall within the second threshold voltage distribution;
    controlling at least a first sense amplifier to sense a threshold voltage of the at least a first of the non-volatile storage elements while it is being programmed according to the second data, while inhibiting at least a second sense amplifier from sensing a threshold voltage of at least a second of the non-volatile storage elements that fell within the first threshold voltage distribution, and which is being programmed according to the second data to fall within a third threshold voltage distribution which is higher than the second threshold voltage distribution; and
    controlling the at least a second sense amplifier to sense the threshold voltage of the at least a second of the non-volatile storage elements responsive to a determination that the threshold voltage of the at least a first of the non-volatile storage elements has transitioned to the second threshold voltage distribution.

2. The method of claim 1, wherein:
    the at least a second sense amplifier is controlled to sense the threshold voltage of the at least a second of the non-volatile storage elements after a predetermined number of programming voltage pulses have been applied to the at least a second of the non-volatile storage elements, after the determination.

3. The method of claim 1, wherein:
    the first and second data comprise lower and upper logical pages, respectively.

4. The method of claim 1, wherein:
    the set of non-volatile storage elements are arranged in a plurality of NAND strings.

5. The method of claim 1, wherein:
    the second and third threshold voltage distributions represent different data states.

6. The method of claim 1, wherein:
    the at least a second sense amplifier is controlled to sense the threshold voltage of the at least a second of the non-volatile storage elements responsive to a determination that the threshold voltage of the at least a first of the non-volatile storage elements exceeds a lower boundary of the second threshold voltage distribution by a margin.

7. The method of claim 6, wherein:
    the margin comprises at least one of a sensing margin and a noise margin.

8. A method for programming non-volatile storage, comprising:
    programming a set of non-volatile storage elements, including at least a first non-volatile storage element and at least a second non-volatile storage element, to a first threshold voltage distribution, the at least a first non-volatile storage element is programmed to a threshold voltage in the first threshold voltage distribution which is outside of a higher, second threshold voltage distribution which overlaps with the first threshold voltage distribution;
    programming the at least a first non-volatile storage element to the second threshold voltage distribution from the threshold voltage in the first threshold voltage distribution which is outside of the second threshold voltage distribution;
    programming the at least a second non-volatile storage element from the first voltage threshold distribution to a third voltage threshold distribution which is higher than the second voltage threshold distribution;
    when the at least a first non-volatile storage element is being programmed to the second threshold voltage distribution, and when the at least a second non-volatile storage element is being programmed to the third threshold voltage distribution, controlling at least a first sense amplifier to sense a threshold voltage of the at least a first non-volatile storage element, and inhibiting at least a second sense amplifier from sensing a threshold voltage of the at least a second non-volatile storage element;
    determining when the at least a first non-volatile storage element has been programmed to the second threshold voltage distribution; and
    controlling the at least a second sense amplifier to sense the threshold voltage of the at least a second non-volatile storage element, responsive to the determining step.

9. The method of claim 8, wherein:
    the at least a second sense amplifier is controlled to sense the threshold voltage of the at least a second non-volatile storage element after a predetermined number of programming voltage pulses have been applied to the at least a second non-volatile storage element, after the determining step determines that the at least a first non-volatile storage element has been programmed to the second threshold voltage distribution.

10. The method of claim 8, wherein:
    the first and second data comprise lower and upper logical pages, respectively.

11. The method of claim 8, wherein:
    the set of non-volatile storage elements are arranged in a plurality of NAND strings.

12. The method of claim 8, wherein:
    the second and third threshold voltage distributions represent different data states.

13. The method of claim 8, further comprising:
    determining when the at least a first non-volatile storage element has been programmed to a threshold voltage which exceeds a lower boundary of the second threshold voltage distribution by a margin; and
    controlling the at least a second sense amplifier to sense the threshold voltage of the at least a second non-volatile storage element responsive to the determining when the at least a first non-volatile storage element has been programmed to the threshold voltage which exceeds the lower boundary of the second threshold voltage distribution by the margin.

14. The method of claim 13, wherein:
    the margin comprises at least one of a sensing margin and a noise margin.

15. The method of claim 8, further comprising:
    determining when a predetermined number of voltage pulses have been applied to the at least a second of the non-volatile storage elements, after the at least a first non-volatile storage element has been programmed to the second threshold voltage distribution; and controlling the at least a second sense amplifier to sense the threshold voltage of the at least a second non-volatile storage element responsive to the determining when the predetermined number of voltage pulses have been applied to the at least a second of the non-volatile storage elements.

16. The method of claim 8, wherein:
the at least a first non-volatile storage element is programmed to the threshold voltage in the first threshold voltage distribution which is outside of a higher, second threshold voltage distribution, and the at least a second non-volatile storage element is programmed to the first threshold voltage distribution, based on a logical page of data.

17. The method of claim 16, wherein:
the at least a first non-volatile storage element is programmed to the second threshold voltage distribution, and the at least a second non-volatile storage element is programmed to the third threshold voltage distribution, based on another logical page of data.

18. A method for programming non-volatile storage, comprising:
programming a set of non-volatile storage elements, including at least first and second non-volatile storage elements, to a first threshold voltage distribution;
programming the at least a first non-volatile storage element from the first threshold voltage distribution to a second threshold voltage distribution which is higher than the first threshold voltage distribution, at least in part, but lower than a third threshold voltage distribution, while programming the at least a second non-volatile storage element from the first threshold voltage distribution to the third threshold voltage distribution;
controlling at least a first sense amplifier to sense whether the at least a first non-volatile storage element has been programmed to the second threshold voltage distribution, while inhibiting at least a second sense amplifier from sensing whether the at least a second non-volatile storage element has been programmed to the third threshold voltage distribution; and
controlling the at least a second sense amplifier to sense whether the at least a second non-volatile storage element has been programmed to the third threshold voltage distribution when the at least a first sense amplifier indicates that the at least a first non-volatile storage element has been programmed to the second threshold voltage distribution.

19. The method of claim 18, further comprising:
controlling the at least a second sense amplifier to sense whether the at least a second non-volatile storage element has been programmed to the third threshold voltage distribution when the at least a first sense amp indicates that the at least a first non-volatile storage element has been programmed to a threshold voltage which exceeds a lower boundary of the second threshold voltage distribution by a margin.

20. The method of claim 18, further comprising:
determining when a predetermined number of programming voltage pulses have been applied to the at least a second of the non-volatile storage elements, after the at least a first non-volatile storage element has been programmed to the second threshold voltage distribution; and
controlling the at least a second sense amplifier to sense the threshold voltage of the at least a second non-volatile storage element responsive to the determining when the predetermined number of programming voltage pulses have been applied to the at least a second of the non-volatile storage elements.

\* \* \* \* \*